US010872678B1

(12) United States Patent
Fackenthal et al.

(10) Patent No.: US 10,872,678 B1
(45) Date of Patent: Dec. 22, 2020

(54) SPECULATIVE SECTION SELECTION WITHIN A MEMORY DEVICE

(71) Applicant: Micron Technology, Inc., Boise, ID (US)

(72) Inventors: Richard E. Fackenthal, Carmichael, CA (US); Jahanshir Javanifard, Carmichael, CA (US); Duane R. Mills, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/446,467

(22) Filed: Jun. 19, 2019

(51) Int. Cl.
*G11C 29/44* (2006.01)
*G11C 11/408* (2006.01)
*G11C 11/22* (2006.01)

(52) U.S. Cl.
CPC ...... *G11C 29/4401* (2013.01); *G11C 11/2253* (2013.01); *G11C 11/4087* (2013.01); *G11C 11/221* (2013.01)

(58) Field of Classification Search
CPC .................................. G11C 8/10; G11C 29/04
USPC ............................................. 365/230.06, 200
See application file for complete search history.

(56) References Cited

U.S. PATENT DOCUMENTS

| | | | | | |
|---|---|---|---|---|---|
| 4,885,720 | A * | 12/1989 | Miller | ..................... | G11C 29/84 365/200 |
| 5,347,484 | A * | 9/1994 | Kwong | ................. | G11C 29/808 365/200 |
| 5,377,152 | A * | 12/1994 | Kushiyama | ............ | G11C 29/02 365/210.12 |
| 6,041,006 | A * | 3/2000 | Tsuchiya | ............... | G11C 29/848 365/200 |
| 6,111,800 | A * | 8/2000 | Allan | ...................... | G11C 29/26 365/189.02 |
| 6,236,602 | B1 * | 5/2001 | Patti | ....................... | G11C 29/42 365/200 |
| 7,924,638 | B2 * | 4/2011 | Gajjewar | .............. | G11C 29/848 365/195 |
| 8,885,426 | B1 * | 11/2014 | Burstein | ................ | G11C 29/44 365/201 |
| 2008/0165609 | A1 * | 7/2008 | Mittal | ...................... | G11C 8/10 365/230.03 |
| 2014/0189450 | A1 * | 7/2014 | Varadarajan | ....... | G11C 29/4401 714/718 |
| 2015/0135040 | A1 * | 5/2015 | Lee | ..................... | G06F 11/1666 714/773 |
| 2015/0310926 | A1 * | 10/2015 | Akamatsu | .............. | G11C 29/76 365/96 |
| 2017/0123946 | A1 * | 5/2017 | Wu | ...................... | G06F 11/1441 |

(Continued)

*Primary Examiner* — Michael T Tran
(74) *Attorney, Agent, or Firm* — Holland & Hart LLP

(57) ABSTRACT

Methods, systems, and devices for speculative memory section selection are described. Defective memory components in one memory section may be repaired using repair components in another memory section. Speculative selection of memory sections may be enabled, whereby access lines in multiple memory sections may be selected when a memory command indicating an address in one memory section is received. While the access lines in the multiple memory sections are selected, a determination of whether repair components in another memory section are to be accessed is performed. Based on the determination, the access line in one of the memory sections may be maintained and the access lines in the other memory sections may be deselected.

23 Claims, 16 Drawing Sheets

(56) References Cited

U.S. PATENT DOCUMENTS

| | | | | |
|---|---|---|---|---|
| 2017/0178753 | A1* | 6/2017 | Kim | G06F 11/167 |
| 2017/0331031 | A1* | 11/2017 | Bak | H01L 21/768 |
| 2018/0373605 | A1* | 12/2018 | Kim | G06F 3/0685 |
| 2018/0374521 | A1* | 12/2018 | Jain | G11C 8/16 |
| 2019/0051371 | A1* | 2/2019 | Kim | G11C 29/4401 |
| 2019/0095295 | A1* | 3/2019 | Ahmed | G11C 29/842 |
| 2019/0096508 | A1* | 3/2019 | Kim | G11C 29/787 |
| 2019/0146870 | A1* | 5/2019 | Cha | G06F 3/0679 |
| | | | | 714/755 |
| 2019/0156909 | A1* | 5/2019 | Lee | G11C 29/72 |
| 2019/0187901 | A1* | 6/2019 | Park | G06F 3/0658 |
| 2019/0189632 | A1* | 6/2019 | Lee | H01L 27/11575 |
| 2019/0288805 | A1* | 9/2019 | Chung | G11C 29/52 |
| 2019/0294335 | A1* | 9/2019 | Kim | G06F 3/064 |
| 2019/0304565 | A1* | 10/2019 | Kim | G11C 29/781 |
| 2019/0348140 | A1* | 11/2019 | Cho | G11C 29/844 |
| 2019/0371391 | A1* | 12/2019 | Cha | G06F 11/106 |
| 2020/0027523 | A1* | 1/2020 | Okada | G11C 29/44 |
| 2020/0050368 | A1* | 2/2020 | Lee | G06F 3/064 |
| 2020/0057574 | A1* | 2/2020 | Lee | G06F 3/0683 |
| 2020/0066368 | A1* | 2/2020 | Johnson | G11C 29/785 |
| 2020/0073573 | A1* | 3/2020 | Park | G06F 3/0659 |
| 2020/0082396 | A1* | 3/2020 | Chow | G06K 19/045 |
| 2020/0091188 | A1* | 3/2020 | Lee | H01L 27/11524 |
| 2020/0111520 | A1* | 4/2020 | Park | G11C 11/4074 |
| 2020/0133806 | A1* | 4/2020 | Her | G11C 16/30 |
| 2020/0152285 | A1* | 5/2020 | Nakaoka | G11C 5/14 |
| 2020/0160927 | A1* | 5/2020 | Jung | H01L 27/2481 |

\* cited by examiner

SPECULATIVE SECTION SELECTION WITHIN A MEMORY DEVICE

BACKGROUND

The following relates generally to a system that includes at least one memory device and more specifically to speculative section selection within a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

In some cases, a memory device may contain portions of memory storage (e.g., some quantity of memory cells) that are defective, or that are unusable for memory storage. This may reduce the amount of available memory storage or cause other problems (e.g., reliability issues).

DETAILED DESCRIPTION

Figure 1:
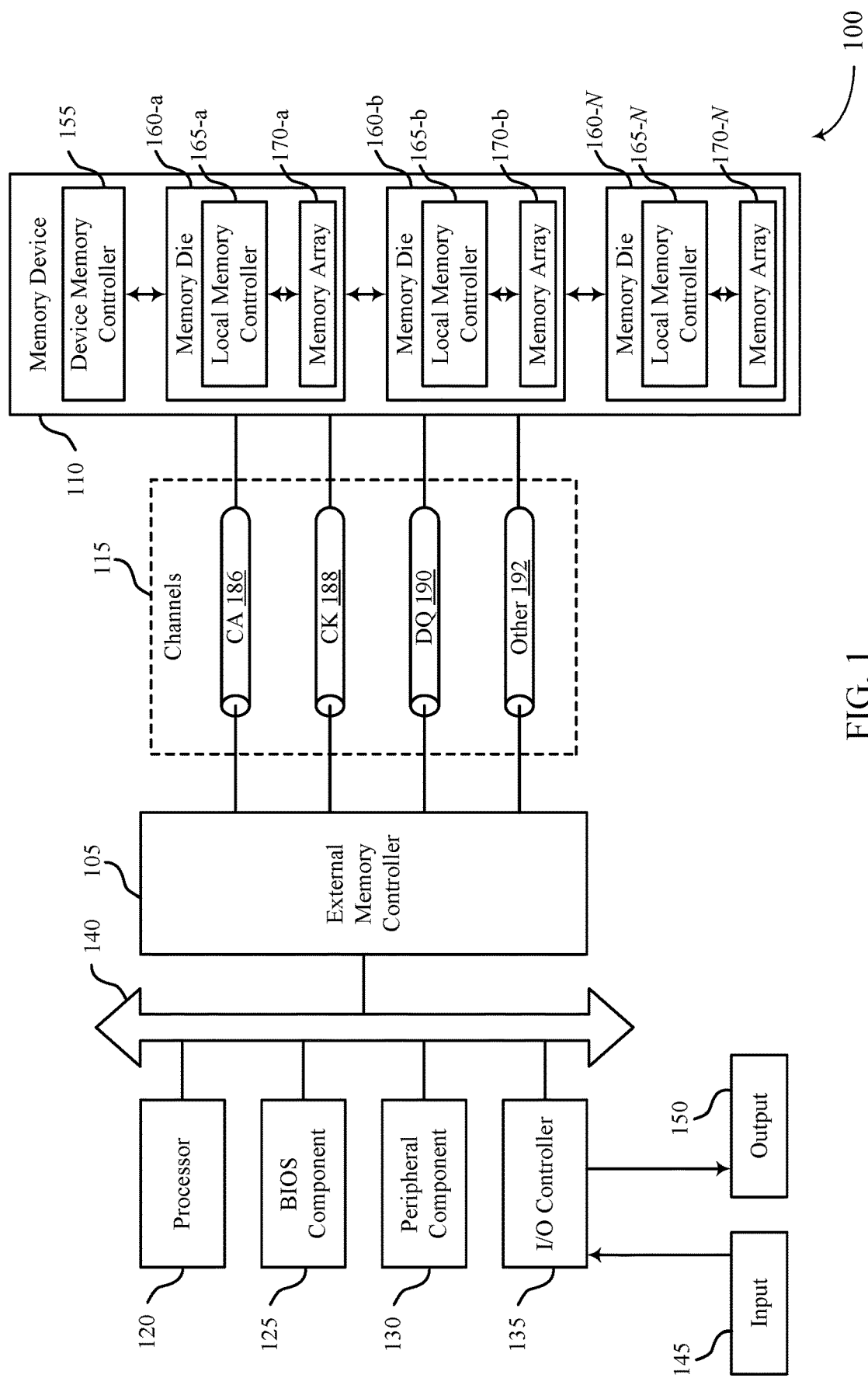
FIG. 1 illustrates an example of a system that supports speculative section selection within a memory device in accordance with examples as disclosed herein.

In some cases, imperfections or defects may be introduced into a memory device (e.g., during manufacturing). For example, a memory device may include defective or corrupt (e.g., unusable or unreliable) memory storage components (e.g., defective memory cells, rows, etc.). Memory storage components may also be referred to as memory components. Accordingly, a memory device may include one or more memory storage repair sections containing memory storage components that may be used instead of (or in place of) defective memory storage components. The memory storage components located in the memory storage repair sections may also be referred to as "repair components" or alternatively as "redundant components."

Memory storage may be divided into memory sections, and in some cases, defective memory storage components in a memory section may be associated with (e.g., during a testing phase) repair components within the same memory section. For example, a memory address of a defective memory storage component ("defective memory address") may be associated with (mapped to) a memory address of a repair component ("repair address"). In some cases, associating defective memory components in a memory section solely with repair components in the same memory section may cause a reduction in the yield of the memory device. For example, if there are more defective memory components than repair components in a memory section, some or all of the memory section may become unusable. Additionally or alternatively, even if the repair components in one memory section are exhausted (all are utilized to repair defective memory components in the same section), there may be unused repair components in another memory section.

As such, systems and techniques as described herein, in which defective memory components in one memory section may be repaired using repair components in the same memory section and/or in another memory section (such techniques may be referred to as "cross-section repair"), may increase yield and more efficiently utilize the resources within a memory device. To support cross-section repair, a determination of which memory section contains repair components corresponding to a defective memory component may occur before an associated memory operation is executed (as the repair components may be in a different section of the memory device). However, determining which memory section contains the repair components before executing a memory operation may increase the execution time (latency) of the memory operation—e.g., the execution time may include the time period for determining the correct repair address to access.

Accordingly, as described herein, a memory device may enable a speculative selection operation mode—e.g., via circuitry in one or more memory sections, via a memory controller, etc.—where multiple memory sections may be selected in response to receiving a command containing a memory address for one of the memory sections (at the time the multiple memory sections are selected, it may not yet be known which of the multiple memory sections includes a relevant repair component, and thus the selection may be speculative). Selecting the multiple memory sections may include selecting and/or precharging access lines (e.g., digit lines) in the multiple memory sections. During the precharging, whether a received memory address is defective and, if so, a repair address corresponding to the memory address may be determined—e.g., using a logic circuit, using instructions from a memory controller, etc. After identifying the repair address, the memory section containing the one or more relevant repair components may be determined and access lines in the memory sections not containing the repair or redundant address may be deselected (which may, for example, include discharging the previously selected (e.g., precharged) access lines). Also, the memory section containing the correct repair address may maintain a selection (activation, precharging) of the correct access line(s) (e.g., a digit line and/or plate line) and may otherwise continue the memory operation, such as by selecting one or more additional access lines in that section (e.g., selecting a word line) corresponding to the memory operation.

In some examples, a mapping (or "repair mapping") may be used to relate memory addresses of memory storage components identified as defective in a memory section—e.g., during a testing phase—with repair addresses of repair components that are contained within the same memory section as the memory storage components and/or repair components that are contained within a different memory section. When defective memory storage components in one memory section are associated with repair components in the same and other memory sections, a speculative selection operating mode may be enabled for multiple memory sections—e.g., at least the memory section with the defective memory storage components and the other memory section with the associated repair components, and possible other memory sections groups to support cross-section repair—to enable efficient selection of a repair component. In some cases, where repair components external to a memory section are used, a speculative selection operating mode is enabled at multiple memory sections after determining that all of the repair components in one of the memory sections have been employed to repair defective memory components.

According to a speculative selection operating mode, when one or more memory sections receive memory addresses associated with a memory operation intended for one memory section, the multiple memory sections may each select or activate one or more access lines (e.g., a digit line and/or plate line) within the respective memory section. The received memory addresses may be compared with known defective memory addresses (e.g., using a repair mapping) to determine whether the associated memory components are defective and to determine (e.g., also using the repair mapping) if a repair component is contained within the same memory section or a different memory section as the associated memory component.

In some cases, a portion of the repair mapping may be stored in or otherwise available to (accessible by) a memory section. In one example, only known defective memory addresses and corresponding repair addresses for a memory section may be stored in a memory section. In another example, only known defective memory addresses and corresponding repair addresses for a group of memory sections (e.g., memory sections configured to be speculatively selected together) may be stored in a memory section. In some cases, the entire repair mapping may be stored in and/or available to a memory section—e.g., each memory section may store all of the known defective memory addresses and corresponding repair addresses, or otherwise be able to access all of the known defective memory addresses and corresponding repair addresses (e.g., by exchanging information with a controller or other aspect of the memory device).

In one example, a circuit (e.g., a logic circuit) within a memory section may identify that a received memory address matches a known defective memory address and determine that a repair component associated with the defective memory address is contained within the memory section. After determining that the repair component is located within the memory section, the circuit may notify other memory sections, which have been speculatively selected based on receiving the memory address, that the repair component is located within the memory section. After receiving the notification from the memory section—e.g., at circuitry within the other memory sections—access lines (e.g., digit and/or plate lines) within the other memory sections may be deselected. Additionally or alternatively, circuitry in each of the others speculatively selected memory sections may determine on its own that the repair component is not contained within the respective memory section and access lines within the other memory sections may be deselected.

Features of the disclosure are initially described in the context of a memory system and memory die as described with reference to FIGS. 1-3. Features of the disclosure are described in the context of a memory device, a memory structure, a timing diagram, and process flows as described with reference to FIGS. 4-10. These and other features of the disclosure are further illustrated by and described with reference to apparatus diagrams and flowcharts that relate to speculative section selection within a memory device as described with references to FIGS. 11-16.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. The host device or external memory controller 105 may control memory operations such as reading and writing information to a memory device. For example, the host device may send information to the memory device, where the information may include addresses to be accessed during a read operation, addresses to access during a write operation, or data to be written to the memory device during a write operation. The host device may then receive confirmation or requested data from the memory device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input devices 145 may represent a device or signal external to the system 100 that provides information, signals, or data to the system 100 or its components. This may include a user interface or interface with or between other devices. In some cases, the input devices 145 may be a peripheral that interfaces with system 100 via one or more peripheral components 130 or may be managed by the I/O controller 135.

The output devices 150 may represent a device or signal external to the system 100 configured to receive an output from the system 100 or any of its components. Examples of the output devices 150 may include a display, audio speakers, a printing device, or another processor on printed circuit board, and so forth. In some cases, the output devices 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. For example, components of system 100 may include a memory device with one or more memory sections of memory cells and one or more repair sections containing redundant memory for repairing possible defective memory cells. In some cases, each of the one or more memory sections may also include a logic circuit and a decoder circuit, which may be used for selecting memory cells in the section to perform various memory operations (e.g., read, write, etc.).

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIGS. 2 and 4. In some cases, a memory array may contain various memory sections, each containing memory storage cells and circuitry for accessing the memory storage cells.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some cases, a device memory controller 155 may send memory operation commands (e.g., read, write, etc.) to one or more sections of memory and may receive confirmation or requested data from the one or more sections of memory.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120. In some cases, a local memory controller 165 may send memory operation commands (e.g., read, write, etc.) to one or more sections of memory and may receive confirmation or requested data from the one or more sections of memory.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

In some cases, a memory controller (e.g., an external memory controller 105, a device memory controller 155, or a local memory controller 165) may be configured to access one or more sections of memory. For example, the memory controller may send a command to read or write memory components located at a memory address in a memory section (a memory array 170 or subset (portion) thereof). But in some cases, the addressed memory component may be a damaged or defective. To mitigate the effects of compromised memory components, repair components may be included in one or more memory sections and may be accessed in place of the compromised memory components. For example, if the memory controller issues a command to access a defective memory component, the memory section may instead access a repair component located in the memory section or another memory section.

Circuitry within a memory section may determine if memory components at a requested memory address are defective and may further determine a corresponding repair address for repair components associated with the defective memory components. In some examples, a memory device may be configured—e.g., during or after a testing procedure—with a mapping relating defective memory addresses with repair memory addresses, where the repair memory addresses may point to repair components that are contained within either the same memory section as the memory components addressed by the defective memory addresses or a different memory section. In such cases, a memory section or a memory controller may enable a speculative selection operating mode within one or more memory sections to enable efficient selection of a repair component associated with a damaged component. As such, when one or more memory sections receive memory addresses associated with a memory operation, the one or more memory sections may each select an access line(s) (e.g., digit line and/or plate line) within its own memory section. Further, the one or more sections may also compare the received memory addresses with the known defective memory addresses to determine whether the associated memory components are defective. In some cases, a repair mapping may store the defective memory addresses and a mapping between the defective memory address and a repair address.

After comparing the received memory addresses with the known defective memory address, the memory sections may determine if an associated repair component is contained within the same memory section as the originally addressed memory component. In some cases, particular repair mappings may be available to each memory section, in which case each memory section may have a repair mapping that contains information regarding defective memory addresses and associated repair memory addresses within only the respective section. Alternatively, each memory section may include an expanded repair mapping that contains information regarding defective memory addresses and associated repair memory addresses within multiple sections of memory (e.g., a particular memory section group or all memory sections).

In one example, a circuit (e.g., a logic circuit) within a memory section may determine that a repair component associated with a requested address is contained within the memory section and may notify other memory sections that the repair component is located within the memory section. After receiving the notification, the other memory sections (or circuitry within the memory sections) may deselect the respective access lines (e.g., digit lines) that were speculatively selected in response to receiving the memory address from the memory controller.

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., PAM3 signal or PAM4 signal) signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
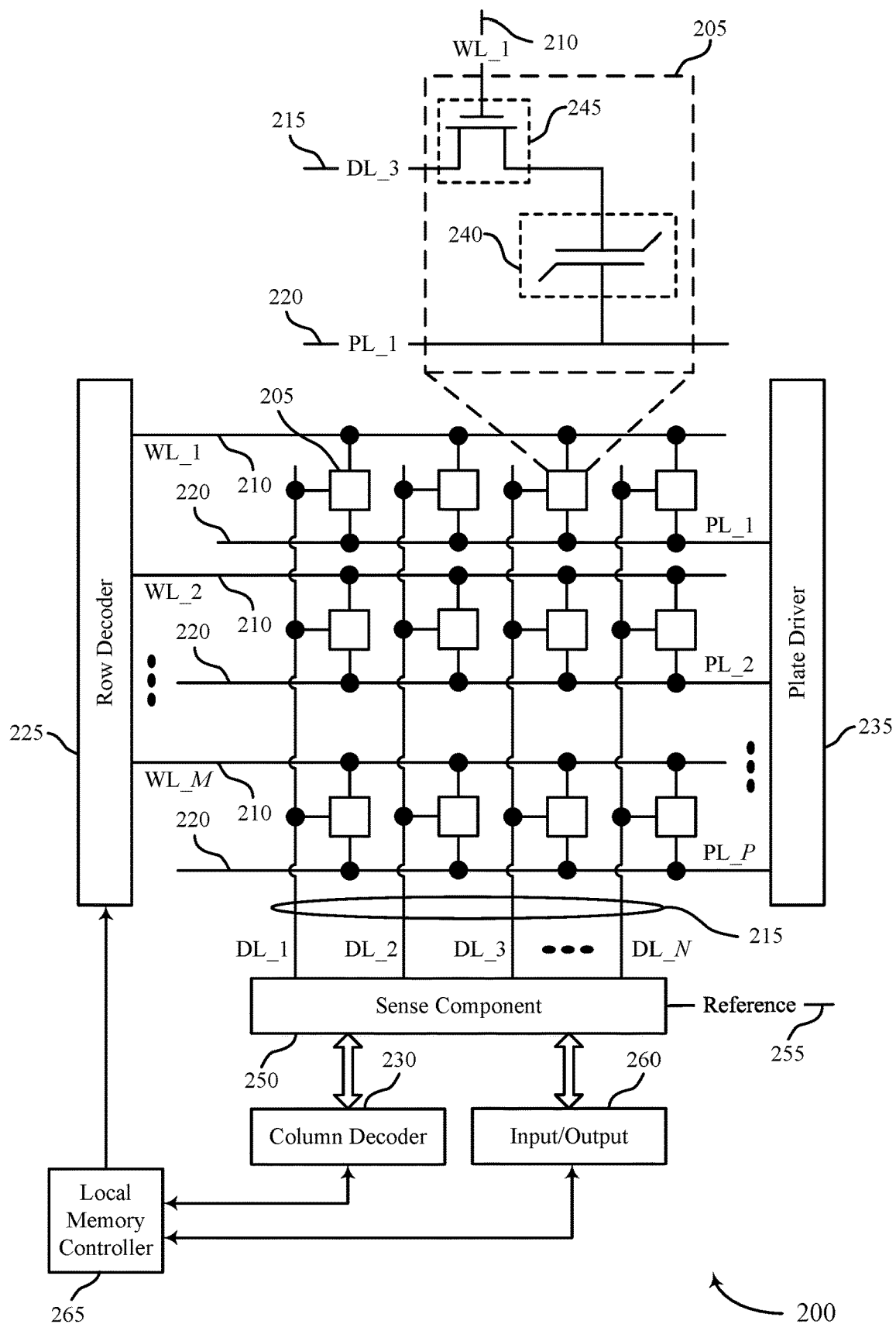
FIG. 2 illustrates an example of a memory die that supports speculative section selection within a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed.

The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205. One or more memory cells 205 may also make up a section of memory, and a section of memory may be assigned a section identifier (ID) or other ID that may be referred to as an address of the memory section or section address. In some cases, one or more cells at a given memory address (e.g., memory cell addresses and/or memory section addresses) may be defective or corrupt. Accordingly, a memory device may contain repair or redundant (e.g., spare) memory cells 205 or memory components (e.g., associated with memory cell addresses and/or memory section addresses) which may be used for storing information in the place of using a defective or corrupt memory component.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation may be controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component. In some architectures, in order to select a word line 210 as part of a memory operation (e.g., read, write, etc.), a memory die 200 may first charge (e.g., precharge) a digit line 215 and a plate line 220 corresponding to an indicated memory address (e.g., one or more memory cells 205), following which the memory die 200 may charge a word line 210 corresponding to the indicated memory address. In some examples, charging the word line 210 may involve bringing the word line 210 from a steady state voltage to an activated voltage in order to perform the memory operation on the indicated memory cells.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge.

During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals.

The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200. In some cases, a local memory controller 265 may send memory operation commands (e.g., read, write, etc.) to one or more sections of memory and may receive confirmation or requested data from the one or more sections of memory.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation. For example, a local memory controller 265 may precharge a digit line 215 and a plate line 220 by bringing the digit line 215 voltage high and the plate line 220 voltage low or by bringing a digit line 215 voltage low and a plate line 220 voltage high. In some cases, a local memory controller 265 may precharge a digit line 215 and a plate line 220 associated with a memory operation (e.g., read, write, etc.) before charging or changing the voltage of a word line 210 associated with the memory operation. In some cases, precharging a digit line 215 and/or a plate line 220 may take a defined amount of time (e.g., 20 nanoseconds (ns)), which may introduce a delay when accessing a word line 210.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some cases, a memory controller (e.g., the local memory controller 265) may perform operations on one or more sections of memory, where the operation may indicate reading or writing to memory components (e.g., memory cells 205 or memory sections) that are damaged or defective. Accordingly, circuitry within a memory section may determine if a received memory address is associated with a defective memory component and may further determine an address for a repair or redundant component associated with the defective memory component. In some examples, a memory die 200 may be configured with a mapping relating defective memory addresses with repair memory addresses, where the repair memory components may be contained within the same memory section as the defective memory components or may be contained within a different memory section.

In such cases, a speculative selection operating mode may be enabled—e.g., by a memory section or a local memory controller 265—at multiple memory sections to enable efficient selection of a repair component associated with a damaged component. When operating in the speculative selection mode, the multiple sections may each select plate lines and digit lines within the respective memory sections after one or more of the memory sections receives a memory addresses associated with a memory operation. The multiple memory sections may compare the memory addresses with known defective memory addresses to determine whether the associated memory components are defective and to determine if a repair component is contained within the same memory section as the originally addressed memory components.

In some cases, all or a portion of the known defective memory addresses and the mapping to respective repair components may be available to each section of memory. In other cases, only the known defective memory addresses and the mapping to respective repair components for a memory section may be available to the respective memory section. In one example, a circuit (e.g., a logic circuit) within a memory section may determine that a repair component associated with a requested memory address is contained within the memory section and may notify other memory sections. After receiving the notification, the other memory sections may deselect the selected access lines (e.g., digit lines) in those memory sections.

Although generally discussed in the context of FeRAM, the techniques discussed herein may be employed by other types of memory technology (e.g., DRAM, resistive RAM (RRAM), phase change memory (PCM), etc.). In some cases, the other types of memory may be constructed similar to FeRAM architectures but, for example, may not contain plate lines 220 (e.g., may use a cross-point architecture, etc.). For example, the techniques described herein may be generally applicable to any technology which includes the charging of one or more access lines before a full access voltage is applied across a memory cell by the assertion of another access line, or in which speculative selection of one or more memory sections that support cross-section repair may be beneficial.

Figure 3A:
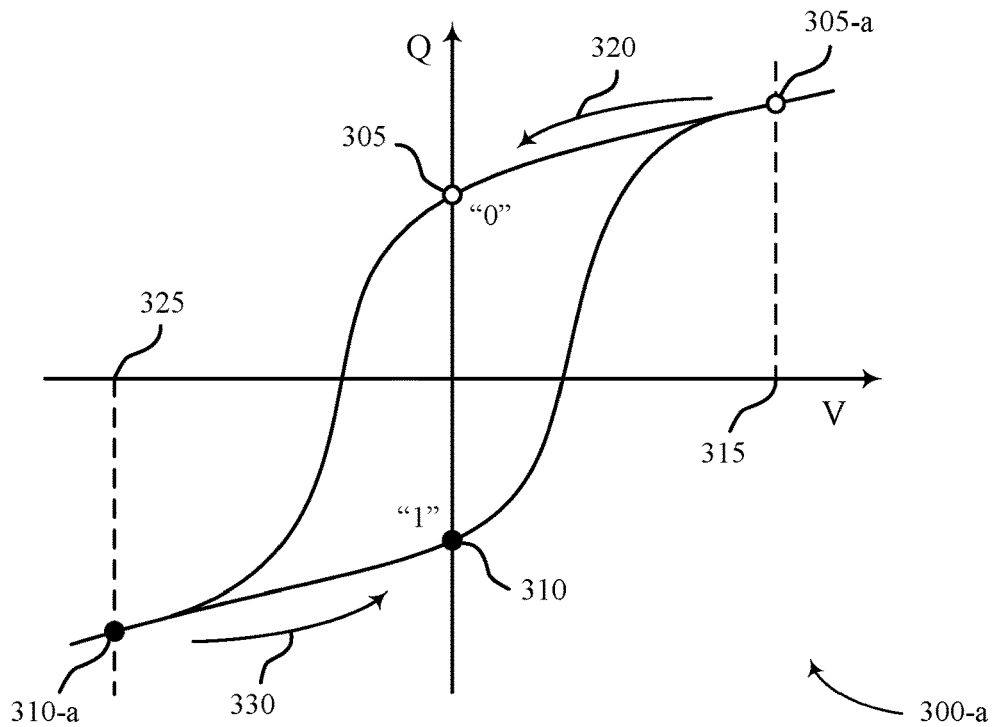
FIGS. 3A and 3B illustrate examples of hysteresis curves that support speculative section selection within a memory device in accordance with examples as disclosed herein.
Figure 3B:
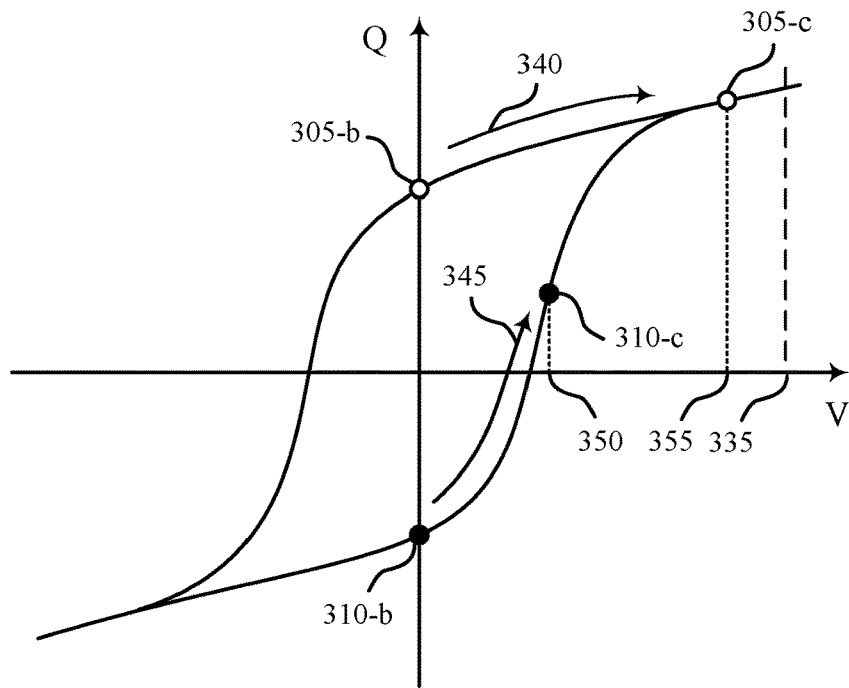

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-a and 300-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some cases, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

Hysteresis curve 300-b illustrates an example of reading a memory cell that is configured to store the charge state 305-b and the charge state 310-b. A read voltage 335 may be applied, for example, as a voltage difference via a digit line 215 and a plate line 220 as described with reference to FIG. 2. Hysteresis curve 300-b may illustrate read operations where the read voltage 335 is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-a (e.g., a logic 1) or at charge state 310-a (e.g., a logic 0).

In some cases, a memory device may include ferroelectric memory cells which follow the hysteresis curves depicted herein. In some examples, the ferroelectric memory cells may make up one or more memory sections and one or more memory repair sections, each containing one or more memory components (e.g., memory cells). In some cases, defective or damaged ferroelectric memory cells from one memory section may be repaired using ferroelectric memory cells (e.g., redundant rows of ferroelectric memory cells) in the same memory section or another memory section. In some cases, logic circuitry within a memory section may be used to identify the ferroelectric memory cells used to repair the defective ferroelectric memory cells based on receiving a memory command addressing a defective ferroelectric memory cell. In some devices, in order to access a ferroelectric cell as part of a memory operation (e.g., read, write, etc.), a memory device may first charge (e.g., precharge) a digit line and a plate line to a prescribed voltage as described herein and then charge a word line to a prescribed voltage as described herein. In some examples, charging the digit line, plate line, and word line corresponding to the memory operation may involve applying voltages based on the hysteresis curves depicted herein.

Figure 4:
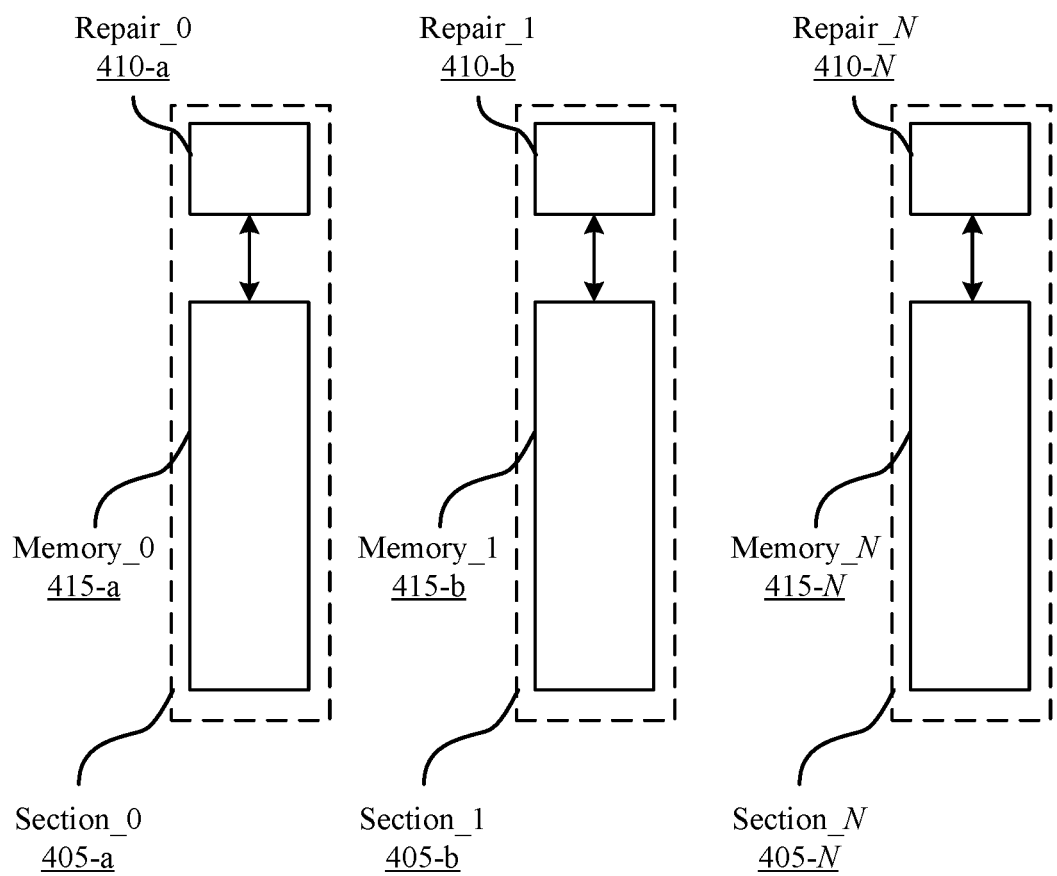
FIG. 4 illustrates an example of a memory device that supports speculative section selection within a memory device in accordance with examples as disclosed herein.

FIG. 4 illustrates an example of a memory device 400 that supports speculative section selection within a memory device in accordance with examples as disclosed herein. In some examples, memory device 400 may implement some aspects of system 100 and/or memory die 200. For example, memory device 400 may include ferroelectric or other types of memory cells divided among one or more memory sections 405. In some cases, memory device 400 may also include one or more repair regions 410 consisting of one or more repair cells (e.g., redundant or spare memory cells, or redundant/spare rows of memory cells), which in some cases, may correspond to the one or more memory storage regions 415 consisting of one or more memory cells.

Memory sections 405 may include regions of memory such as a subset, a sub-array, a subdivision, one or more subdivisions, one or more patches or units, one or more banks of memory, and so forth. In some cases, each memory section 405 may have its own dedicated set of repair regions 410 (e.g., a set of 64 repairs). In some cases, the repair regions 410 may be physically contained within a memory section 405 and may be used to repair defective (e.g., compromised, corrupted, unreliable etc.) memory components (e.g., one or more memory cells in a memory storage region 415) in the same memory section 405. Memory components may be associated with a memory address, where the memory address may correspond to one or more memory cells within a memory section 405, may correspond to a memory section 405, and/or may correspond to another specified size of memory storage.

In some cases, repair regions 410 may be shared among (available for repairs associated with) one or more memory sections 405, where a set of repair regions 410 may be physically contained within one memory section 405 and may be used to repair unusable memory components (e.g., defective components) in one or more other memory sections 405. A mapping process may be carried out (e.g., during a testing phase) in order to identify defective memory components (e.g., rows) within a memory section 405 (e.g., within a memory storage region 415 in a memory section 405) and map each defective address to a repair region 410 (e.g., to a redundant or spare memory address within a repair region 410). The repair mapping may be programmed into a memory controller or a logic circuit associated with a memory section 405 containing defective memory components, and in some cases, the mapping may be contained within a memory section 405.

In one example, memory device 400 may include N memory sections 405, where the N sections may be associated with N repair regions 410 and N memory storage regions 415. For example, memory device 400 may include memory sections 405-a, 405-b, up to memory section 405-N (e.g., Section_0, Section_1, . . . , Section_N), may include repair regions 410-a, 410-b, up to repair region 410-N (e.g., Repair_0, Repair_1, . . . , Repair N), and may include memory storage regions 415-a, 415-b, up to memory storage region 415-N (e.g., Memory_0, Memory_1, . . . , Memory_N). In some cases, memory device 400 may associate defective memory components (e.g., rows in a memory storage region 415) in one memory section 405 (e.g., memory section 405-a) with components corresponding to a repair region 410 (e.g., redundant or spare memory addresses) in another memory section 405 (e.g., memory section 405-b). In some cases, certain memory sections 405 may be grouped together to support cross-section repair. For example, two or more adjacent (contiguous, immediately neighboring) memory sections may be grouped together, where each of the adjacent memory sections may speculative select access lines within its own memory section when a memory address for any one of the grouped memory sections is received at any one or more of the grouped memory sections.

Associating components in repair regions 410 and defective components across memory sections 405 may allow a greater versatility in selecting repair regions 410 and may therefore increase memory yield compared to a scheme where repair regions 410 are only associated with defective components within the same memory section 405. For example, a memory device may allow repair regions 410 and defective components to be associated across memory sections 405 such that defective components (e.g., rows) in one memory section 405 (e.g., memory section 405-a) may be repaired even if the repair region 410 in that memory section 405 is completely used.

In some examples, a memory section 405 may be entirely dedicated to repair components. That is, all of the memory storage component in a memory section 405 may be allocated as a repair region 410. In such cases, other memory sections 405 may repair defective memory components using repair components in their own memory sections 405 and/or repair components in the memory section 405 dedicated to repair components. Also, when a speculative selection mode is enabled for a memory section 405, both the memory section 405 and the memory section 405 dedicated to repair components may be selected when a memory address is received for the memory section.

Figure 5:
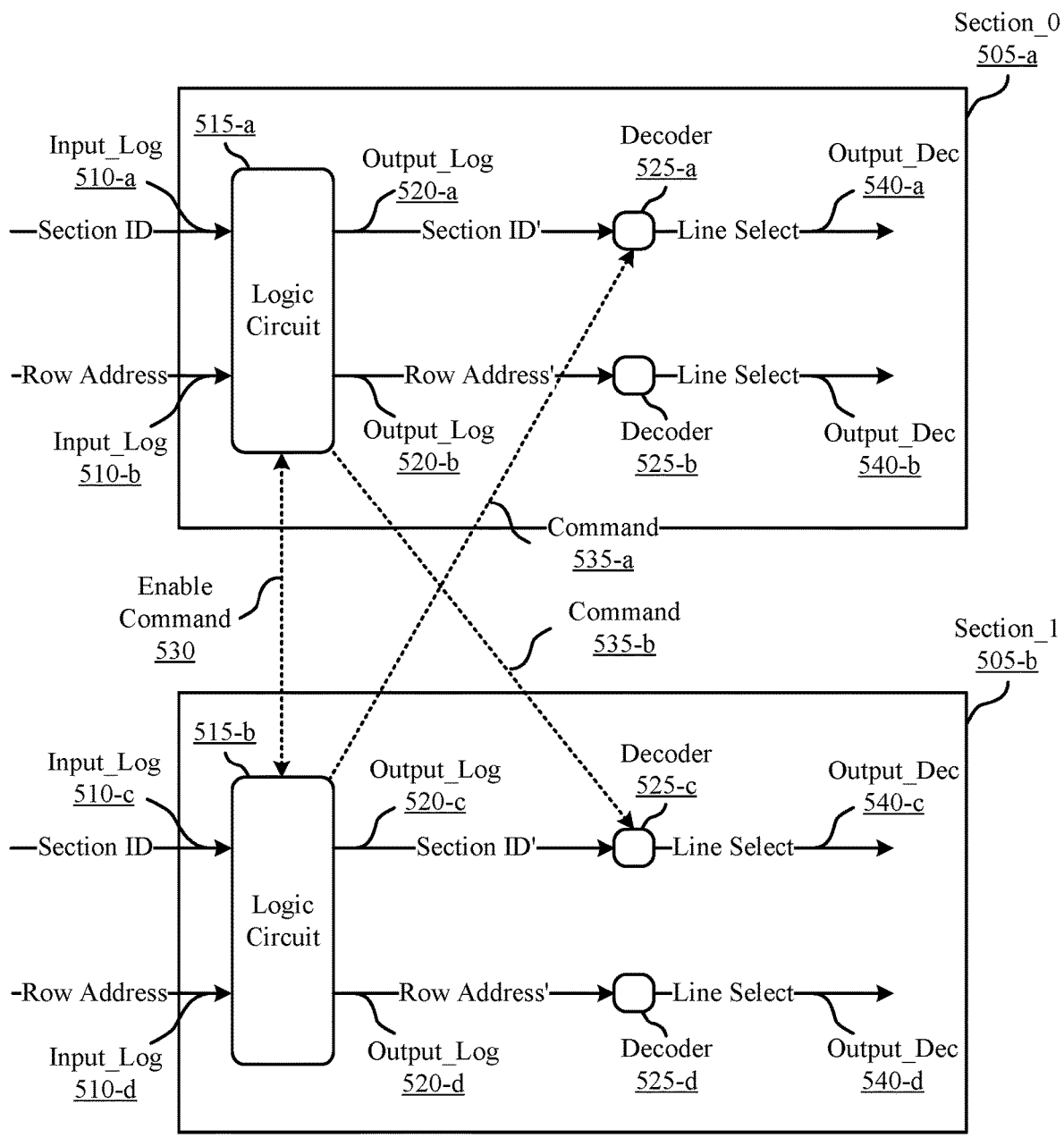
FIG. 5 illustrates an example of a memory structure that supports speculative section selection within a memory device in accordance with examples as disclosed herein.

FIG. 5 illustrates an example of a memory structure 500 that supports speculative section selection within a memory device in accordance with examples as disclosed herein. In some examples, memory structure 500 may implement some aspects of system 100, memory die 200, and/or memory device 400. For example, memory structure 500 may include one or more memory sections 505, where each memory section 505 may include multiple ferroelectric or other types of memory cells. In some cases, a memory section 505 may be an example of a memory section 405, as described with reference to FIG. 4.

A logic circuit 515 within memory structure 500 may be configured to receive memory operation commands from a memory controller associated with the memory device, via input logic lines 510. Input logic lines 510 may be examples of conductive traces or wires. The logic circuit 515 may further send commands to a decoder 525 via output logic lines 520, where output logic lines 520 may be examples of conductive traces or wires. For example, the logic circuit 515 may send a command for the decoder 525 to select one or more access lines as specified in the memory command. In some case, the logic circuit 515 may be configured to determine whether memory addresses received in the memory command correspond to defective components and may further be configured to determine addresses for repair components associated with any defective components. The logic circuit 515 may include logic gates, such as NAND, AND, NOR gates to accomplish one or more of the above-described features.

The decoders 525 may be configured to apply different voltages to one or more access lines in order to perform various memory operations (e.g., read, write, etc.) using the one or more access lines. For example, the decoders 525 may be configured to change the voltage of a plate line and/or digit line (e.g., precharge the plate line and/or digit line) and change the voltage of a word line (e.g., activate the word line) to access memory cells for the memory operation. A decoder 525 may include an operational amplifier, as well as a speculative selection component that is configured to deactivate or deselect an access line when a deselect command is received by the decoder 525.

One or more memory sections 505 may be configured to store electronic data in one or more memory cells. Additionally, a memory section 505 may be configured with redundant or spare memory cells that may be used to replace the functionality of damaged memory cells—i.e., repair cells—within the same memory section 505 or within a different memory section 505. A memory section 505 may also be associated with a logic circuit 515 and one or more decoders 525. In some cases, a memory section 505 may be a dedicated repair section, meaning all of the memory cells in the memory section 505 are used to repair memory cells located in another memory section 505. In some cases, multiple memory sections 505 may be grouped together for speculative selection operation and repairing defective memory components within the multiple memory sections 505. For example, sections may be grouped in adjacent pairs, such that defective memory components in one memory section 505 may be repaired with repair components a paired, adjacent section. In some cases, a memory section 505 may be grouped or paired with one or more dedicated repair sections. Additionally, memory sections 505 may be grouped such that a first group of memory sections 505 may be associated with a first dedicated group of one or more repair memory sections 505.

In some examples, a logic circuit 515 of one or more memory sections 505 may receive a signal over input logic lines 510 such as a memory address in the form of a section ID and a row address to be accessed for a memory operation (e.g., read, write, etc.). A logic circuit 515 may be programmed with repair information (e.g., a repair mapping) that identifies defective rows within its own respective memory section 505 and maps the defective memory rows to repair rows in its own memory section 505 and/or other memory sections 505. A logic circuit 515 may therefore be able to send a signal via output logic lines 520 in the form of a section ID and a row address for a repair (or redundant) row if a defective row is to be accessed within the memory section 405—e.g., if a received memory address matches a defective memory address of the memory section 405 and a corresponding repair row is located within the same memory section 405. Additionally or alternatively, a logic circuit 515 in a memory section 405 may receive a section ID and row address corresponding to a memory address and may determine that the memory address is valid (or not defective)—e.g., the logic circuit 515 may determine that the memory address does not match any defective memory addresses. After determining that a received memory address is valid, the logic circuit 515 may transmit the valid memory address over output logic line 520 within the memory section 505. In either case, the memory address to be accessed may be transmitted via output logic lines 520 to a decoder 525 and may be used to select an access line (e.g., digit line) for performing the memory operation.

In some cases (e.g., when all of the repair rows in a memory section 505 have been used, if a memory section 505 is associated with a separate memory section 505 dedicated to repairs, etc.), the logic circuit 515 may send an enable command 530 to logic circuits 515 in one or more other memory sections 505—e.g., prior to receiving the memory address over input logic lines 510. The enable command 530 may indicate to the one or more other logic circuits 515 to enable a speculative selection operating mode and to select a digit line after a memory command addressing memory components within the memory section 505 is received—e.g., because a repair address corresponding to received memory address of the memory section 505 may be located in the one or more other memory sections 505. The one or more other logic circuits 515 may then transmit a command over output logic line 520 to a decoder 525 in order to select an access line (e.g., digit line) for performing the memory operation.

Each of the logic circuits 515 in the enabled sections—i.e., the sections having selected access lines—may determine whether a repair address corresponding to the received memory address is contained in its respective section. For example, a logic circuit 515 may be programmed with or may otherwise have access to a repair mapping for its respective memory section 505 and/or other memory sections 505. As such, the logic circuit 515 may compare—e.g., based on the repair mapping—the memory address from the input logic line 510 with repair addresses to determine if the memory address is defective or compromised and to further determine whether the repair address is contained in its own memory section 505 or within another memory section 505. If a logic circuit 515 in a given section determines that the repair address is contained in its respective memory section 505, the logic circuit in that memory section 505 may create a command 535 which may be sent to decoders 525 in one or more other memory sections 505. The command 535 may include a command to deselect any selected access lines that have been selected as a result of the enable command 530. Further, the memory section 505 containing the repair memory address may continue creating output from the decoder (e.g., decoder output 540) and select an access line (e.g., a word line) corresponding to the memory cells needed to complete the memory operation.

Additionally or alternatively, a memory controller may be programmed with defective memory addresses and corresponding repair or redundant addresses and may perform the actions described above as being performed by a logic circuit 515. For example, a memory controller may send an enable command 530 to enable a speculative selection mode, determine a location of a repair of a defective memory address, and send a command to the decoders 525 in memory sections 505 that do not contain the repair component to notify the decoders 525 in those memory sections 505 to deselect the access lines. In some cases, the memory controller may further send input commands via input logic lines 510 (e.g., an access command to perform a memory operation) to one or more memory sections 505 that may be associated with the memory operation, as determined by the controller. For example, a memory controller may determine that one or more memory sections 505 may contain a memory address or a repair memory address associated with a memory operation and may send the command (e.g., an access command) via input logic lines 510 to only the one or more memory sections 505. Additionally or alternatively, the memory controller may determine that one memory section 505 contains the memory address corresponding to the memory operation (e.g., either a valid or a repair address) and may send the command to only the one memory section 505.

In one example, logic circuit 515-a (e.g., corresponding to memory section 505-a, or Section_0) may receive information over input logic lines 510-a and 510-b, such as a memory address in the form of a section ID and a row address, respectively, to be used for a memory operation (e.g., read, write, etc.). Logic circuit 515-a may be programmed with repair information (e.g., a repair mapping) associated with defective memory addresses and repair addresses for memory section 505-a and/or other memory sections 505 (e.g., memory section 505-b, or Section_1). In some cases—e.g., when a received memory address points to defective memory cells—logic circuit 515-a may send a repair address via output logic lines 520-a and 520-b in the form of a section ID and a row address, respectively after identifying that the received memory address points to defective memory cells. Additionally or alternatively, logic circuit 515-a may receive a section ID and row address corresponding to a valid memory address—e.g., as determined by comparing the memory address to defective memory addresses—and may therefore send a memory address via output logic lines 520-a and 520-b corresponding to the valid memory address. The output memory address may be sent to decoders 525-a and 525-b, respectively, and may be used to select an access line (e.g., digit line) for performing the memory operation.

In some cases—e.g., if memory section 505-a has used a particular number, or all, of its own repair rows; if a memory section 505 is associated with a separate memory section 505 dedicated to repairs; if a signal enabling speculative selection is received, etc. —logic circuit 515-a may send an enable command 530 to a logic circuit 515-b in another memory section 505-b (e.g., as part of an enable command 530 sent to one or more other memory sections 505). For example, enable command 530 may trigger logic circuit 515-b to enable a speculative selection operating mode and to speculatively select an access line (e.g., digit line) after receiving a memory command addressed to memory section 505-a—e.g., because a defective memory address of memory section 505-a may correspond to a repair address in memory section 505-b. Accordingly, logic circuit 515-b may send a second command via output logic lines 520-c and 520-d to decoders 525-c and 525-d, respectively, in order to select an access line after receiving a first memory address pointing to memory cell in memory section 505-a.

As described above, logic circuits 515-a and 515-b may determine whether a repair address corresponding to a defective memory address is contained in one of the respective memory sections 505-a and 505-b. In one example, logic circuit 515-a may determine that the repair address for the defective memory address is contained in memory section 505-a and may send an indication to logic circuit

515-*b* that the repair address is contained in memory section 505-*a*. As such, logic circuit 515-*a* may create command 535-*b* which may be sent to decoder 525-*c* in memory section 505-*b* notifying decoder 525-*b* that the repair address is contained in memory section 505-*a* and indicating for decoder 525-*c* to deselect the selected access line. Accordingly, decoder 525-*c* may deselect any corresponding access lines, and decoders 525-*a* and 525-*b* may continue the memory operation by creating decoder output 540-*a* and 540-*b* and selecting an access line (e.g., a word line) corresponding to the repair cells.

In another example, logic circuit 515-*b* may determine that the repair address for the indicated defective address is contained in memory section 505-*b* and may create command 535-*a* to send to decoder 525-*a*, including a command to deselect access lines selected in response to the memory address received via input logic lines 510-*a* and 510-*b*. Accordingly, decoder 525-*a* may deselect any corresponding access lines, and decoders 525-*c* and 525-*d* may continue the memory operation by creating decoder output 540-*c* and 540-*d* and selecting an access line (e.g., a word line) corresponding to the repair cells.

Figure 6:
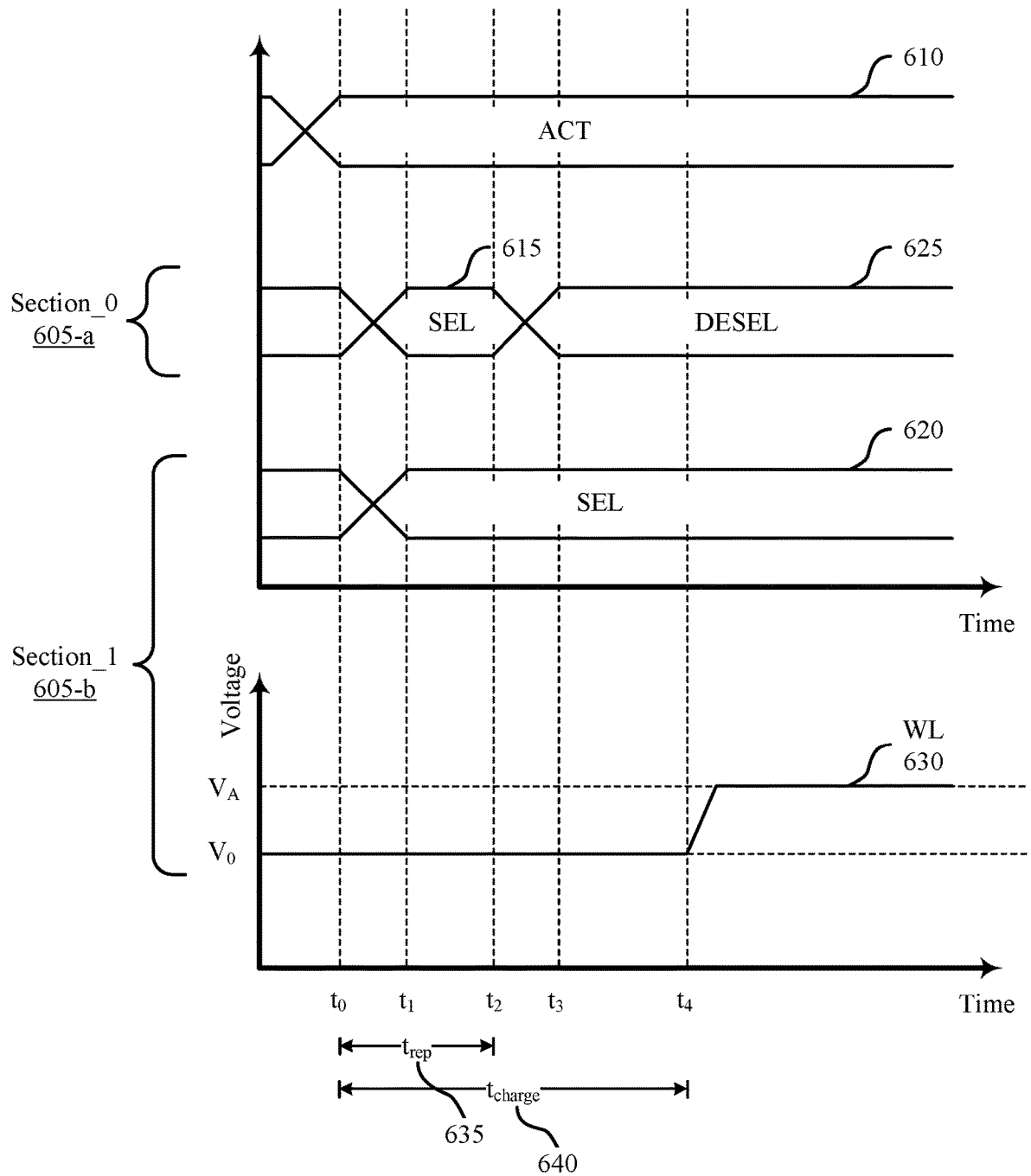
FIG. 6 illustrates an example of a timing diagram that supports speculative section selection within a memory device in accordance with examples as disclosed herein.

FIG. 6 illustrates an example of a timing diagram 600 that supports speculative section selection within a memory device in accordance with examples as disclosed herein. In some examples, timing diagram 600 may implement some aspects of system 100, memory die 200, and/or memory device 400. For example, timing diagram 600 may be implemented in one or memory sections 605, where each memory section 605 may include multiple ferroelectric or other types of memory cells.

Timing diagram 600 illustrates the transmission of signals within a memory structure. Activation command 610 may represent the transmission of multiple bits of information to one or more memory sections (e.g., memory section 605-*a* and 605-*b*) in the memory structure. Select operation 615 and deselect operation 625 may represent signals that are transmitted within memory section 605-*a*—e.g., between a decoding circuit and an access line within memory section 605-*a*. Select operation 620 and word line voltage 630 may respectively represent the transmission of signals between and application of voltages to components included within memory section 605-*b*.

In one example, timing diagram 600 may illustrate memory operations within memory sections 605-*a* and 605-*b*, (e.g., Section_0 and Section_1, respectively). At t0, memory sections 605-*a* and 605-*b* may receive an activation command 610 corresponding to a subsequent memory operation (e.g., read, write, etc.). In some cases, activation command 610 may include a memory address corresponding to the memory operation, such as an address of a column or digit line and/or a section ID. After receiving the activation command 610, circuitry (e.g., a logic circuit) within memory sections 605-*a* and 605-*b* may check if the memory command is addressed to the corresponding section. If a speculative selection mode is enabled and the memory command is addressed to one section (e.g., memory section 605-*a*), that section (e.g., memory section 605-*a*) may select one or more access line (e.g., a digit line and/or plate line) within the section and the section to which the memory operation is not addressed (e.g., memory section 605-*b*) may also select one or more access lines (e.g., a digit line and/or plate line) within the unaddressed section after receiving the activation command 610. If a speculative selection mode is disable and the memory command is addressed to one section (e.g., memory section 605-*a*), that section (e.g., memory section 605-*a*) may select one or more access line (e.g., a digit line and/or plate line) within the section, while the section not addressed by the memory command (e.g., memory section 605-*b*) may not select an access lines (e.g., a digit line and/or plate line) within the unaddressed section.

In one example of a memory operation addressed to memory section 605-*a*, at t0, circuitry within memory section 605-*a* (e.g., a logic circuit and a decoder) may cause an access line (e.g., digit line) to be selected during a select operation 615 based on receiving the activation command 610. In some cases, select operation 615 may cause a plate line voltage to be brought high and a digit line voltage to be brought low, or vice versa. In some examples, at or before t0, a logic circuit or other circuitry within memory section 605-*a* may notify memory section 605-*b* to enable a speculative selection operating mode which may configure memory section 605-*b* to select an access line (e.g., a digit line corresponding to a repair address) within memory section 605-*b* when a received memory command includes a memory address of either memory section 605-*a* or memory section 605-*b*. In some cases, the speculative selection notification may be based on a determination that a repair address for a received memory address may be contained in either memory section 605-*a* or 605-*b*. For example, a determination to enable a speculative selection operation mode at memory section 605-*b* may be made if all the repair addresses in memory section 605-*a* are used, if a threshold number of repair addresses in memory section 605-*a* are used, if 605-*b* is a dedicated repair for memory section 605-*a*, if a signal is received from a memory controller, etc. As such, at t0, circuitry within memory section 605-*b* (e.g., a logic circuit) may cause an access line to be selected during a select operation 620. At t1, the select operations 615 and 620 may be transmitted to components within memory section 605-*a* and memory section 605-*b*.

In some examples, at t0, circuitry (e.g., a logic circuit) in both memory sections 605-*a* and 605-*b* may begin to determine whether a repair address for the indicated memory address is contained within the respective memory section 605-*a* or 605-*b*. For example, the circuitry in memory sections 605-*a* and 605-*b* may be programmed with or otherwise have access to a repair mapping indicating defective memory addresses in one or more sections, along with corresponding repair memory addresses. Accordingly, the circuitry in memory sections 605-*a* and 605-*b* may compare the address received in activation command 610 with repair addresses and may determine if the received address is valid or defective. If one or both of memory sections 605-*a* or 605-*b* determine the received address is defective, one or both of memory sections 605-*a* or 605-*b* may then determine whether the repair address corresponding to the defective memory address is contained within its own section or the other section.

In one example, at or before t2, circuitry (e.g., a logic circuit) in memory section 605-*b* may determine that a repair address for the memory address received in activation command 610 is contained within memory section 605-*b* and may notify memory section 605-*a* of such. In response to the notification, at t2, circuitry (e.g., a logic circuit) within memory section 605-*a* may initiate a deselect operation 625 for the selected access line(s) within memory section 605-*a*, while circuitry within memory section 605-*b* may maintain the selection of access line(s) within memory section 605-*b*. In some cases, the maximum time to determine the correct repair address may be described as $t_{rep}$ 635, which in some cases may be approximately 5 ns to 10 ns. At t3, the deselect operation may be processed and the access line(s) within memory section 605-*a* may be deselected—which may include discharging the access lines. At or before $t_4$, the access lines within memory section 605-a may be completely deselected or discharged. Additionally, the select operation may continue within memory section 605-b until the access line is fully selected (e.g., precharged).

The total time from the beginning of the memory operation at to until the correct access line is fully charged may be represented as $t_{charge}$, which in some cases may be approximately 20 ns. In some cases, an access line is fully charged when the voltage on the access line reaches a threshold voltage associated with applying a preferred voltage across a memory cell. At $t_4$, the access line(s) within memory section 605-b may be fully charged and the access line(s) within memory section 605-a may be fully deselected or discharged. Accordingly, circuitry within memory section 605-b may change the word line voltage 630 (e.g., corresponding to the memory address indicated in the memory operation) from an initial voltage, $V_0$, to an activated voltage, $V_A$. After the word line is activated within memory section 605-b, an access voltage may be applied across one or more repair cells within memory section 605-b, causing the repair cells to discharge onto respective access lines (e.g., digit lines). The resulting voltages on the access lines (e.g., digit lines) may then be sensed and the information stored in the memory cells may be read—e.g., by a memory controller.

As shown in timing diagram 600, $t_{rep}$ may be less than $t_{charge}$; thus, the repair address may be determined while the access line(s) are charging, allowing for a reduction in latency. For example, speculatively selecting digit lines in both memory sections 605-a and 605-b and concurrently determining a row redundancy location while the access line(s) are charging may reduce latency that may otherwise be incurred by performing such operations sequentially.

Figure 7:
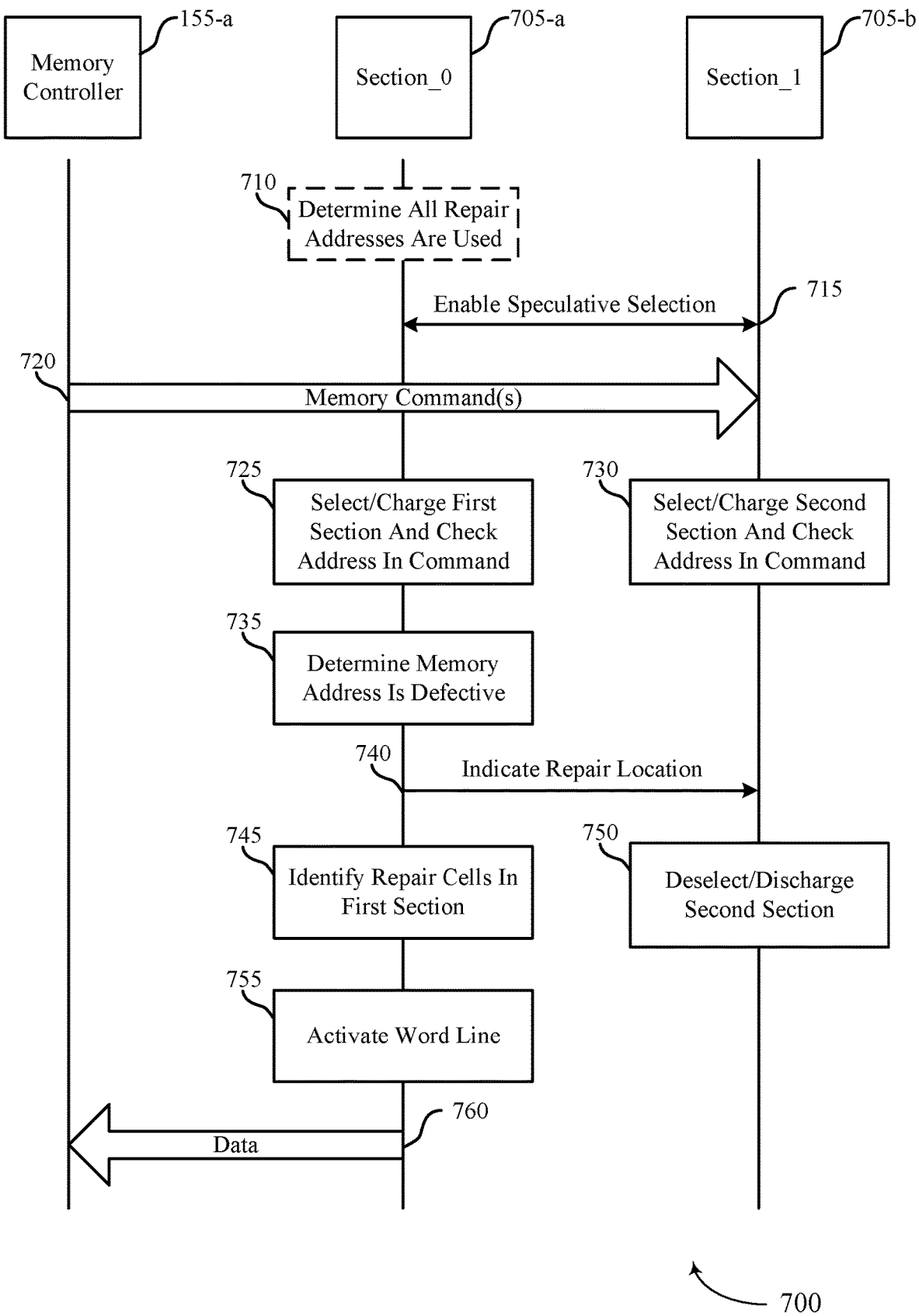
FIG. 7 illustrates an example of a process flow that supports speculative section selection within a memory device in accordance with examples as disclosed herein.

FIG. 7 illustrates an example of a process flow 700 that supports speculative section selection within a memory device in accordance with examples as disclosed herein. In some examples, process flow 700 may implement aspects of system 100, memory die 200, memory device 400, memory structure 500, and/or timing diagram 600.

In some cases, a device memory controller 155-a may transmit a memory command (e.g., activation, read, write, etc.) addressed to one memory section, and one or more memory sections (e.g., Section_0 and Section_1) may speculatively select access lines within each section based on receiving the memory command. Both memory sections may then determine whether the received memory address indicates defective memory cells. The memory section that identifies that the received memory address indicates defective memory cells may contain the repair cells for the defective memory cells. Thus, the memory section that identifies that the memory address indicates defective memory cells may notify the other memory section that the repair cells are located in the identifying memory section, and the other memory section may deselect its access lines. Then, the memory section that contains the repair cells may access the repair cells. It is to be understood that, while two sections are shown in process flow 700, such procedures may occur over more than two sections of memory.

In the following description of the process flow 700, the operations between the device memory controller 155-a, first section 705-a (or "Section_0"), and second section 705-b (or "Section_1") may be transmitted in a different order than the order shown, or the operations performed by the device memory controller 155-a, Section_0, and Section_1 may be performed in different orders or at different times. Also, certain operations may be omitted from the process flow 700, or other operations (e.g., operations described in FIGS. 4 to 6 or 8 to 10) may be added to the process flow 700. It is to be understood that while the device memory controller 155-a, Section_0, and Section_1 are shown performing a number of the operations of process flow 700, any circuitry may perform the operations shown.

At 710, in some cases, circuitry (e.g., a logic circuit) in first section 705-a may determine that all of the repair cells within first section 705-a are used—i.e., all of the repair cells have been programmed to store electronic data for corresponding defective memory cells. In some cases, it may be determined that all of the repair addresses in first section 705-a have been used during a testing phase—e.g., by using a fuse load procedure to examine the last repair made. In one example, defective memory cells may be identified in the testing process and may be mapped to available repair cells within first section 705-a. In some cases, the testing phase may also include mapping defective memory cells in first section 705-a to repair cells within another section, such as second section 705-b—e.g., if all the repair addresses in first section 705-a are used. The testing phase may also include programming first section 705-a with the information that all or some of the repair cells within first section 705-a have been used to repair defective cells (e.g., by blowing fuses). In the testing phase, each memory cell and/or row of memory cells in first section 705-a may be tested to ensure that data is properly stored at those memory cells—e.g., by storing and reading data at each memory cell or group of memory cells.

At 715, first section 705-a and/or second section 705-b may enable a speculative selection operating mode in which access lines in both sections may be selected prior to determining which section will be accessed in response to receiving a memory address for either first section 705-a or second section 705-b. Additionally or alternatively, device memory controller 155-a may enable the speculative selection operating mode in sections 705-a and 705-b. In some cases, first section 705-a and/or second section 705-b may enable the speculative selection operating mode based on first section 705-a determining that all of the repairs located in first section 705-a have been used. In other cases, first section 705-a and/or second section 705-b may enable the speculative selection operating mode based on determining that another requirement for speculative selection is met. For example, speculative selection may be enabled if a threshold number of repair addresses in first section 705-a are used, if 705-b is a dedicated repair for first section 705-a, if a signal is received from a memory controller, etc.

At 720, device memory controller 155-a may send one or more memory commands to sections 705-a and 705-b, specifying one or more memory addresses to be accessed. In some cases, the one or more memory commands include an activation command, a read command, a write command, and/or a precharge command. A memory address included in the one or more memory commands may refer to one or more memory cells, a memory address included in the one or more memory commands may refer to a section of memory, or both.

At 725, circuitry (e.g., a logic circuit and decoder) in first section 705-a may select/charge first section 705-a—e.g., first section 705-a may charge one or more digit lines in first section 705-a—in response to receiving a memory command addressed to first section 705-a. First section 705-a may then check a memory address received in the memory command to verify whether the memory address is associated with a valid address or a defective address within first section 705-a. For example, circuitry in first section 705-a may compare the memory address from the command with known defective memory addresses. In some cases, first section 705-*a* may only compare the memory address with defective memory addresses that correspond to repair addresses of first section 705-*a*. In other cases, first section 705-*a* may compare the memory address with defective memory addresses that correspond to repair addresses of sections 705-*a* and 705-*b*. If the memory address is valid i.e., addresses functional memory cells—circuitry within first section 705-*a* may access the memory cells addressed by the received memory address according to the memory command.

Similarly, at 730, circuitry (e.g., a logic circuit and decoder) in second section 705-*b* may select/charge second section 705-*b*—e.g., charge one or more digit lines in second section 705-*b*—in response to receiving the memory command addressed to first section 705-*a* or in response to receiving a signal from first section 705-*a*. Second section 705-*b* may then check the address from the memory command to verify whether the memory address is a valid memory address and/or is associated with a repair address within second section 705-*b*. For example, circuitry in second section 705-*b* may compare the memory address from the command with known defective memory address. In some cases, second section 705-*b* may only compare the memory address with defective memory addresses that correspond to repair address of second section 705-*b*. In other cases, second section 705-*b* may compare the memory address with defective memory addresses that correspond to repair addresses of first section 705-*a* and 705-*b*. In such cases, if second section 705-*b* determines that the memory address is valid—e.g., by failing to match the received memory address with a known defective memory address of first section 705-*a* or second section 705-*b*—circuitry within second section 705-*b* may discharge second section 705-*b*—e.g., may discharge the one or more digit lines in second section 705-*b*.

At 735, circuitry (e.g., a logic circuit) in first section 705-*a* may determine that the memory address associated with the memory command is defective or corrupted—e.g., after matching the memory address with a known defective memory address—and may further determine that the repair address is within first section 705-*a*—e.g., by identifying the mapping between the defective memory address and the corresponding repair address. Therefore, at 740, the circuitry in first section 705-*a* may indicate a repair address location to second section 705-*b*—e.g., first section 705-*a* may indicate that the repair address is located in first section 705-*a*.

Accordingly, at 745, circuitry (e.g., a logic circuit) in first section 705-*a* may identify the repair cells in first section 705-*a* corresponding to the identified repair address and, at 755, circuitry in first section 705-*a* may activate a word line corresponding to the repair cells. In some cases, circuitry in first section 705-*a* may identify the repair cells when determining the memory address from the memory command is defective (e.g., as a part of 735). After the word line is activated, an access voltage may be applied across one or more repair cells, causing the repair cells to discharge onto respective access lines (e.g., digit lines). The resulting voltages on the access lines (e.g., digit lines) may then be sensed and the information stored in the memory cells may be read—e.g., by a local memory controller.

At 750, circuitry (e.g., a logic circuit and decoder) in second section 705-*b* may deselect second section 705-*b*— which may involve removing an applied voltage and/or discharging one or more charged digit lines in second section 705-*b*—in response to the indication of the repair location. That is, any charged access lines in second section 705-*b* may be deselected based on determining that the repair cells corresponding to a received memory address are located in first section 705-*a*.

At 760, first section 705-*a* may send the requested data to the device memory controller 155-*a*, as indicated in the memory command. For example, voltages discharged onto the access lines (e.g., digit lines) of the repair cells may be sensed and resulting data may be sent to the device memory controller 155-*a*.

Figure 8:
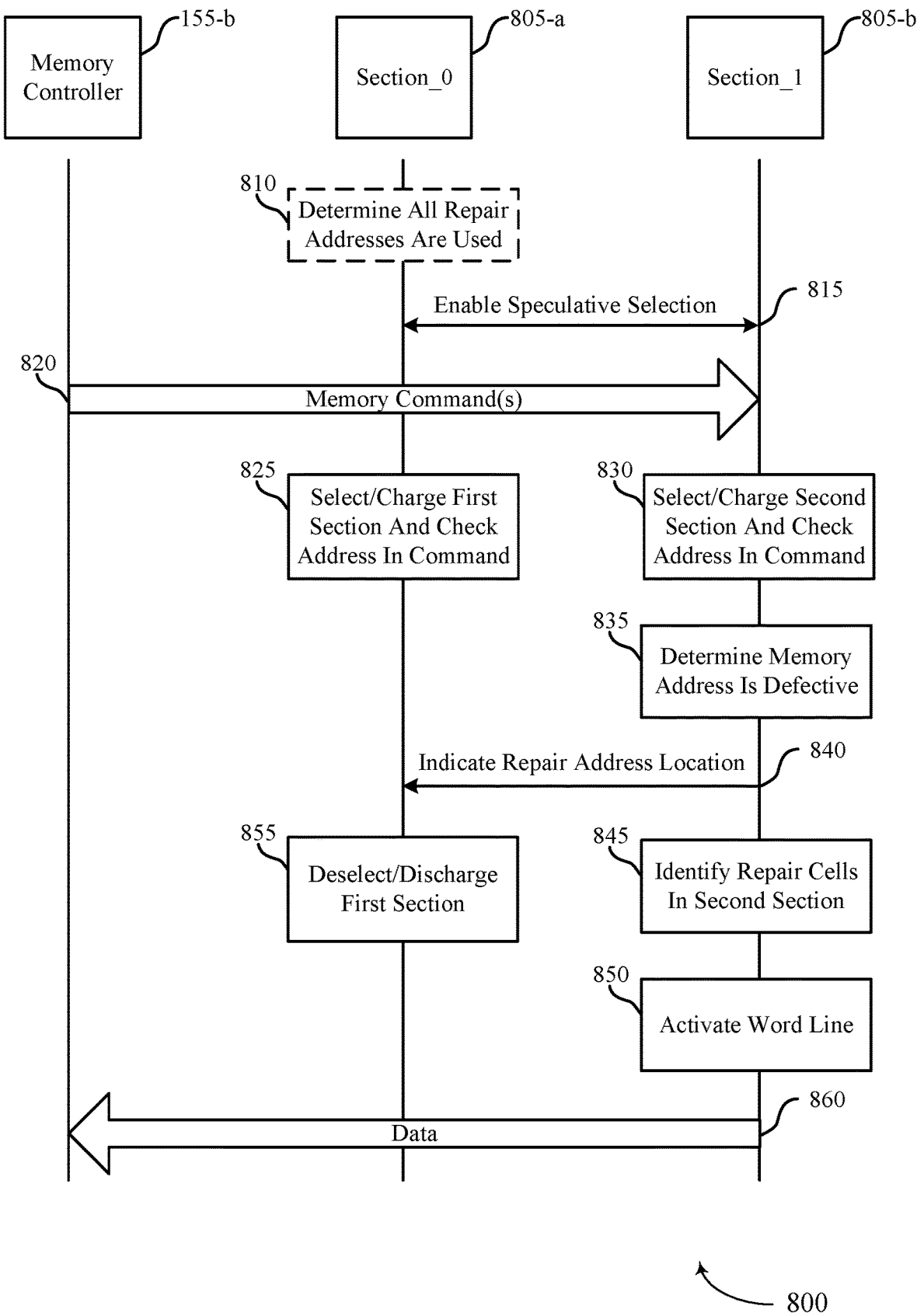
FIG. 8 illustrates an example of a process flow that supports speculative section selection within a memory device in accordance with examples as disclosed herein.

FIG. 8 illustrates an example of a process flow 800 that supports speculative section selection within a memory device in accordance with examples as disclosed herein. In some examples, process flow 800 may implement aspects of system 100, memory die 200, memory device 400, memory structure 500, and/or timing diagram 600.

In some cases, a memory controller may perform a memory command (e.g., read, write, etc.) and one or more memory sections (e.g., Section_0 and Section_1) may respond to the memory command and speculatively select access lines within each section. Both memory sections may then determine whether the received memory address indicates defective memory cells. The memory section that identifies that the received memory address indicates defective memory cells may contain the repair cells for the defective memory cells. Thus, the memory section that identifies that the memory address indicates defective memory cells may notify the other memory section that the repair cells are located in the identifying memory section, and the other memory section may deselect its access lines. Then, the memory section that contains the repair cells may access the repair cells. It is to be understood that, while two sections are shown in process flow 800, such procedures may occur over more than two sections of memory.

In the following description of the process flow 800, the operations between the device memory controller 155-*b*, first section 805-*a* (or "Section_0"), and second section 805-*b* (or "Section_1") may be transmitted in a different order than the order shown, or the operations performed by the device memory controller 155-*b*, Section_0, and Section_1 may be performed in different orders or at different times. Certain operations may also be left out of the process flow 800, or other operations may be added to the process flow 800. It is to be understood that while the device memory controller 155-*b*, Section_0, and Section_1 are shown performing a number of the operations of process flow 800, any circuitry may perform the operations shown.

At 810, in some cases, circuitry (e.g., a logic circuit) in first section 805-*a* may determine that all of the repair cells within first section 805-*a* are used—i.e., all of the repair cells have been programmed to store electronic data for corresponding defective memory cells. In some cases, it may be determined that all of the repair addresses in first section 805-*a* have been used during a testing phase, such as by examining the last repair made using a fuse load procedure. In one example, defective memory cells may be identified in the testing process and may be mapped to available repair cells within first section 805-*a*. If all the repair addresses in first section 805-*a* are used, the testing phase may also include mapping defective memory cells in first section 805-*a* to repair cells within another section (e.g., second section 805-*b*). The testing phase may also include programming first section 805-*a* with the information that all or some of the repair cells within first section 805-*a* have been used to repair defective cells (e.g., by blowing fuses). In the testing phase, each memory cell and/or row of memory cells in first section 805-*a* may be tested to ensure that data is properly stored at those memory cells.

At 815, first section 805-*a* and/or second section 805-*b* may enable a speculative selection operating mode in which access lines in both sections may be selected prior to determining which section will be accessed in response to receiving a memory address. Additionally or alternatively, device memory controller 155-*a* may enable the speculative selection operating mode in sections 805-*a* and 805-*b*. In some cases, first section 805-*a* and/or second section 805-*b* may enable the speculative selection operating mode based on first section 805-*a* determining that all of the repairs located in first section 805-*a* have been used. In other case, first section 805-*a* and/or second section 805-*b* may enable the speculative selection operating mode based on determining that another requirement for speculative selection is met. For example, speculative selection may be enabled if a threshold number of repair addresses in first section 805-*a* are used, if 805-*b* is a dedicated repair for first section 805-*a*, if a signal is received from a memory controller, etc.

At 820, device memory controller 155-*b* may send one or more memory commands to sections 805-*a* and 805-*b*, specifying one or more memory addresses to be accessed. In some cases, the one or more memory commands include an activation command, a read command, a write command, and/or a precharge command. In some cases, a memory address may refer to one or more memory cells, and in other cases, a memory address may refer to a section of memory.

At 825, circuitry (e.g., a logic circuit and decoder) in first section 805-*a* may select/charge first section 805-*a*—e.g., first section 805-*a* may charge one or more digit lines in first section 805-*a*—in response to receiving a memory command addressed to first section 805-*a*. First section 805-*a* may then check a memory address received in the memory command to verify whether the memory address is associated with a valid address or a defective address within first section 805-*a*. For example, circuitry in first section 805-*a* may compare the memory address from the command with known defective memory addresses. In some cases, first section 805-*a* may only compare the memory address with defective memory addresses that correspond to repair addresses of first section 805-*a*. In other cases, first section 805-*a* may compare the memory address with defective memory addresses that correspond to repair addresses of sections 805-*a* and 805-*b*. If the memory address is valid i.e., addresses functional memory cells—circuitry within first section 805-*a* may access the memory cells addressed by the received memory address according to the memory command.

Similarly, at 830, circuitry (e.g., a logic circuit and decoder) in second section 805-*b* may select/charge second section 805-*b*—e.g., charge one or more digit lines in second section 805-*b*—in response to receiving the memory command addressed to first section 805-*a* or in response to receiving a signal from first section 805-*a*. Second section 805-*b* may then check the address from the memory command to verify whether the memory address is a valid memory address and/or is associated with a repair address within second section 805-*b*. For example, circuitry in second section 805-*b* may compare the memory address from the command with known defective memory address. In some cases, second section 805-*b* may only compare the memory address with defective memory addresses that correspond to repair address of second section 805-*b*. In other cases, second section 805-*b* may compare the memory address with defective memory addresses that correspond to repair addresses of first section 805-*a* and 805-*b*. In such cases, if second section 805-*b* determines that the memory address is valid—e.g., by failing to match the received memory address with a known defective memory address of first section 805-*a* or second section 805-*b*—circuitry within second section 805-*b* may discharge second section 805-*b*—e.g., may discharge the one or more digit lines in second section 805-*b*.

At 835, circuitry (e.g., a logic circuit) in second section 805-*b* may determine that the memory address associated with the memory command is defective or corrupted—e.g., by comparing the memory address to known defective memory address—and may further determine that the repair address is within second section 805-*b*—e.g., by identifying the repair address that corresponds to the defective memory address. Therefore, at 840, the circuitry in second section 805-*b* may indicate a repair address location to first section 805-*a*—e.g., indicate the repair address is located in second section 805-*b*.

Accordingly, at 845, circuitry (e.g., a logic circuit) in second section 805-*b* may identify repair cells in second section 805-*b* corresponding to the memory address from the memory command and, at 850, may activate a word line corresponding to the repair cells. In some cases, circuitry in second section 805-*b* may identify the repair cells when determining the memory address from the memory command is defective (e.g., as a part of 835). After the word line is activated, an access voltage may be applied across one or more repair cells, causing the repair cells to discharge onto respective access lines (e.g., digit lines). The resulting voltages on the access lines (e.g., digit lines) may then be sensed and the information stored in the memory cells may be read—e.g., by a memory controller.

At 855, circuitry (e.g., a logic circuit and decoder) in first section 805-*a* may deselect first section 805-*a* (e.g., deselect one or more charged digit lines in first section 805-*a*) in response to the indication of the repair address location.

At 860, second section 805-*b* may send the requested data to the device memory controller 155-*b*, as indicated in the memory command. For example, voltages discharged onto the access lines (e.g., digit lines) of the repair cells may be sensed and resulting data may be sent to the device memory controller 155-*b*.

Figure 9:
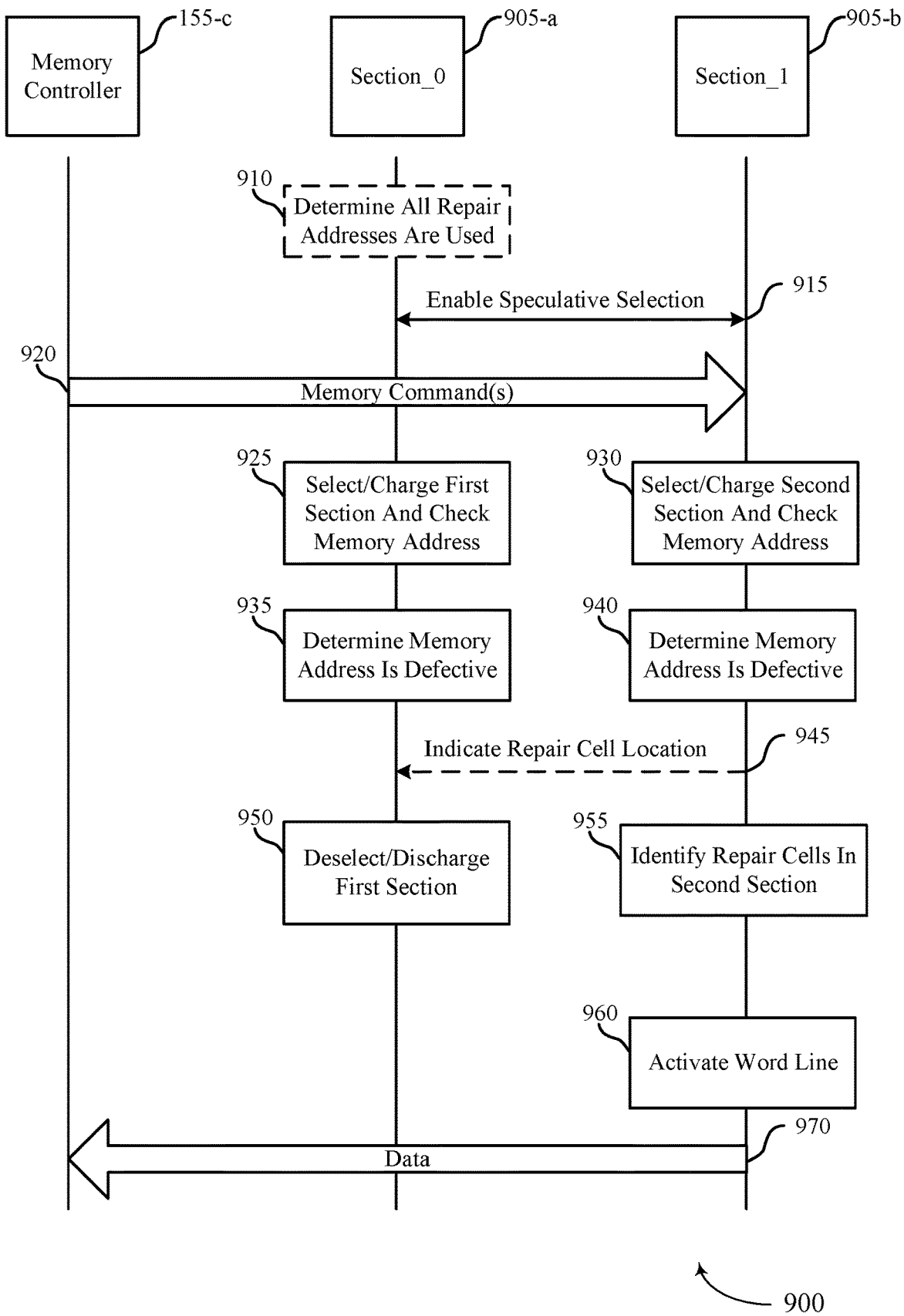
FIG. 9 illustrates an example of a process flow that supports speculative section selection within a memory device in accordance with examples as disclosed herein.

FIG. 9 illustrates an example of a process flow 900 that supports speculative section selection within a memory device in accordance with examples as disclosed herein. In some examples, process flow 900 may implement aspects of system 100, memory die 200, memory device 400, memory structure 500, and/or timing diagram 600.

In some cases, a memory controller may perform a memory command (e.g., read, write, etc.) and one or more memory sections (e.g., Section_0 and Section_1) may respond to the memory command and speculatively select access lines within each section. Both memory sections may then determine whether the received memory address indicates defective memory cells. After determining that the memory address indicates defective memory cells, both memory section may identify which memory section contains the repair cells, and the memory section that does not contain the repair cells may deselect its access lines. Then, the memory section that contains the repair cells may access the repair cells. It is to be understood that, while two sections are shown in process flow 900, such procedures may occur over more than two sections of memory.

In the following description of the process flow 900, the operations between the device memory controller 155-*c*, first section 905-*a* (or "Section_0"), and second section 905-*b* (or "Section_1") may be transmitted in a different order than the order shown, or the operations performed by the device memory controller 155-c, Section_0, and Section_1 may be performed in different orders or at different times. Certain operations may also be left out of the process flow 900, or other operations may be added to the process flow 900. It is to be understood that while the device memory controller 155-c, Section_0, and Section_1 are shown performing a number of the operations of process flow 900, any circuitry may perform the operations shown.

At 910, in some cases, circuitry (e.g., a logic circuit) in first section 905-a may determine that all of the repair cells within first section 905-a are used—i.e., all of the repair cells have been programmed to store electronic data for corresponding defective memory cells. In some cases, it may be determined that all of the repair addresses in first section 905-a have been used during a testing phase, such as by examining the last repair made using a fuse load procedure. In one example, defective memory cells may be identified in the testing process and may be mapped to available repair cells within first section 905-a. If all the repair addresses in first section 905-a are used, the testing phase may also include mapping defective memory cells in first section 905-a to repair cells within another section (e.g., second section 905-b). The testing phase may also include programming first section 905-a with the information that all or some of the repair cells within first section 905-a have been used to repair defective cells (e.g., by blowing fuses). In the testing phase, each memory cell and/or row of memory cells in first section 905-a may be tested to ensure that data is properly stored at those memory cells.

At 915, first section 905-a and/or second section 905-b may enable a speculative selection operating mode in which access lines in both sections may be selected prior to determining which section will be accessed in response to receiving a memory address. Additionally or alternatively, device memory controller 155-a may enable the speculative selection operating mode in sections 905-a and 905-b. In some cases, first section 905-a and/or second section 905-b may enable the speculative selection operating mode based on first section 905-a determining that all of the repairs located in first section 905-a have been used. In other case, first section 905-a and/or second section 905-b may enable the speculative selection operating mode based on determining that another requirement for speculative selection is met. For example, speculative selection may be enabled if a threshold number of repair addresses in first section 905-a are used, if 905-b is a dedicated repair for first section 905-a, if a signal is received from a memory controller, etc.

At 920, device memory controller 155-c may send one or more memory commands to sections 905-a and 905-b, specifying one or more memory addresses to be accessed. In some cases, the one or more memory commands include an activation command, a read command, a write command, and/or a precharge command. In some cases, a memory address may refer to one or more memory cells, and in other cases, a memory address may refer to a section of memory.

At 925, circuitry (e.g., a logic circuit and decoder) in first section 905-a may select/charge first section 905-a—e.g., first section 905-a may charge one or more digit lines in first section 905-a—in response to receiving a memory command addressed to first section 905-a. First section 905-a may then check a memory address received in the memory command to verify whether the memory address is associated with a valid address or a defective address within first section 905-a. For example, circuitry in first section 905-a may compare the memory address from the command with known defective memory addresses. In some cases, first section 905-a may only compare the memory address with defective memory addresses that correspond to repair addresses of first section 905-a. In other cases, first section 905-a may compare the memory address with defective memory addresses that correspond to repair addresses of sections 905-a and 905-b. If the memory address is valid i.e., addresses functional memory cells—circuitry within first section 905-a may access the memory cells addressed by the received memory address according to the memory command.

Similarly, at 930, circuitry (e.g., a logic circuit and decoder) in second section 905-b may select/charge second section 905-b—e.g., charge one or more digit lines in second section 905-b—in response to receiving the memory command addressed to first section 905-a or in response to receiving a signal from first section 905-a. Second section 905-b may then check the address from the memory command to verify whether the memory address is a valid memory address and/or is associated with a repair address within second section 905-b. For example, circuitry in second section 905-b may compare the memory address from the command with known defective memory address. In some cases, second section 905-b may only compare the memory address with defective memory addresses that correspond to repair address of second section 905-b. In other cases, second section 905-b may compare the memory address with defective memory addresses that correspond to repair addresses of first section 905-a and 905-b. In such cases, if second section 905-b determines that the memory address is valid—e.g., by failing to match the received memory address with a known defective memory address of first section 905-a or second section 905-b—circuitry within second section 905-b may discharge second section 905-b—e.g., may discharge the one or more digit lines in second section 905-b.

At 935, circuitry (e.g., a logic circuit) in first section 905-a may determine that the memory address associated with the memory command is defective or corrupted—e.g., by comparing the memory address to defective memory address known for first section 905-a and second section 905-b—and may further determine that the repair address is within second section 905-b—e.g., by identifying the repair address corresponding to the defective memory address.

At 940, circuitry (e.g., a logic circuit) in second section 905-b may also determine that the memory address associated with the memory command is defective or corrupted—e.g., by comparing the memory address to defective memory address known for first section 905-a and second section 905-b—and may further determine that the repair address is within second section 905-b—e.g., by identifying the repair address corresponding to the defective memory address. In some cases, at 945, the circuitry in second section 905-b may therefore indicate a repair address location to first section 905-a—e.g., indicate the repair address is located in second section 905-b.

Accordingly, at 950, circuitry in first section 905-a may deselect first section 905-a—e.g., deselect one or more charged digit lines in first section 905-a—in response to the indication of/or the determination of the repair address.

At 955, circuitry (e.g., a logic circuit) in second section 905-b may identify the repair cells in second section 905-b corresponding to the defective memory address and, at 960, may activate a word line corresponding to the repair cells. In some cases, circuitry in second section 905-b may identify the repair cells when determining the memory address from the memory command is defective (e.g., as a part of 940). After the word line is activated, an access voltage may be applied across one or more repair cells, causing the repair cells to discharge onto respective access lines (e.g., digit lines). The resulting voltages on the access lines (e.g., digit lines) may then be sensed and the information stored in the memory cells may be read—e.g., by a memory controller.

At 970, second section 905-*b* may send the requested data to the device memory controller 155-*c*, as indicated in the memory command. For example, voltages discharged onto the access lines (e.g., digit lines) of the repair cells may be sensed and resulting data may be sent to the device memory controller 155-*c*.

Figure 10:
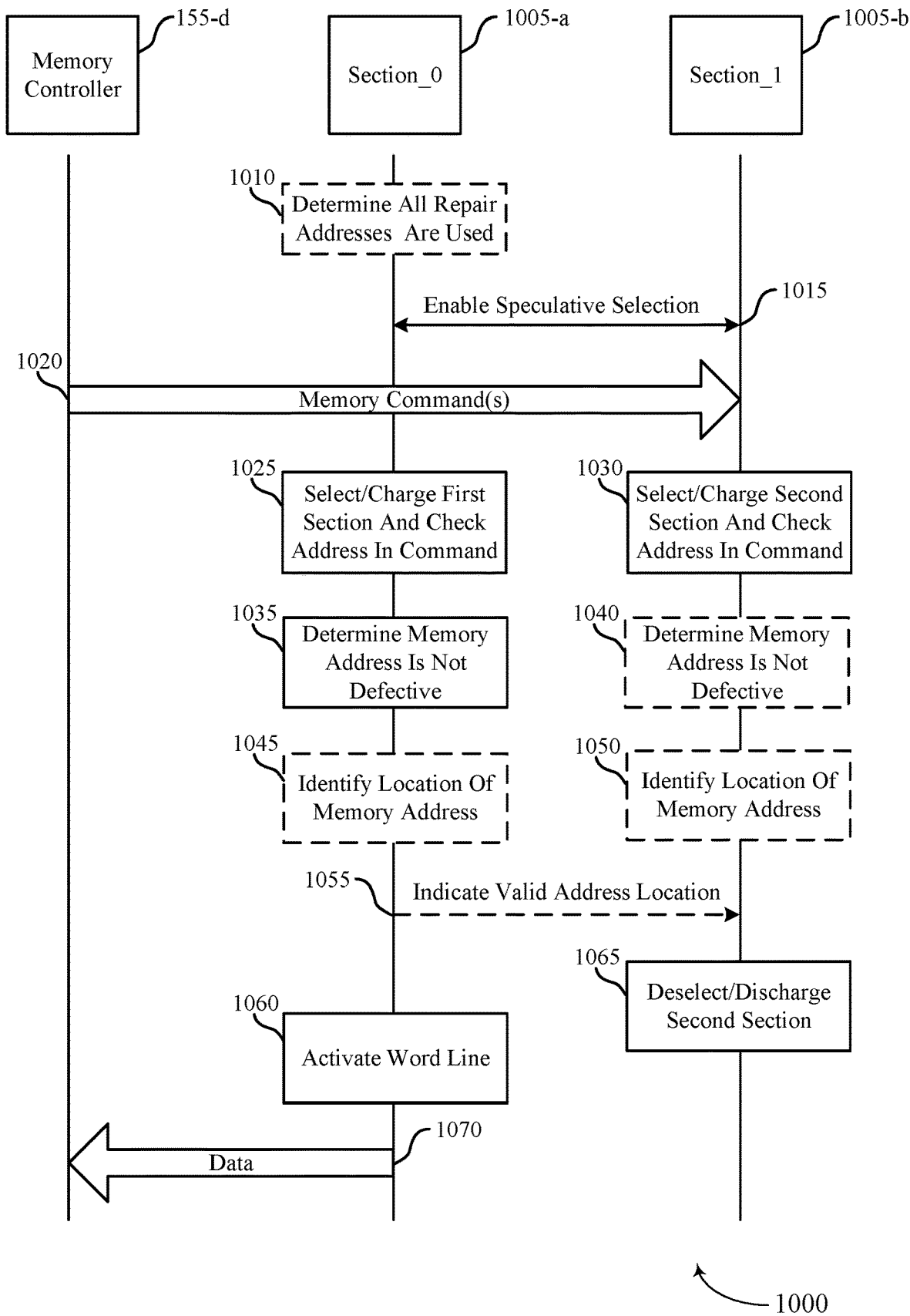
FIG. 10 illustrates an example of a process flow that supports speculative section selection within a memory device in accordance with examples as disclosed herein.

FIG. 10 illustrates an example of a process flow 1000 that supports speculative section selection within a memory device in accordance with examples as disclosed herein. In some examples, process flow 1000 may implement aspects of system 100, memory die 200, memory device 400, memory structure 500, and/or timing diagram 600.

In some cases, a memory controller may perform a memory command (e.g., read, write, etc.) and one or more memory sections (e.g., Section_0 and Section_1) may respond to the memory command and speculatively select access lines within each section. Both memory sections may then determine whether the received memory address indicates defective memory cells. After determining that the memory address indicates valid memory cells, the addressed memory section may access the memory cells, and the unaddressed memory section may deselect its access lines. It is to be understood that, while two sections are shown in process flow 1000, such procedures may occur over more than two sections of memory.

In the following description of the process flow 1000, the operations between the device memory controller 155-*d*, first section 1005-*a* (or "Section_0"), and second section 1005-*b* (or "Section_1") may be transmitted in a different order than the order shown, or the operations performed by the device memory controller 155-*d*, Section_0, and Section_1 may be performed in different orders or at different times. Certain operations may also be left out of the process flow 1000, or other operations may be added to the process flow 1000. It is to be understood that while the device memory controller 155-*d*, Section_0, and Section_1 are shown performing a number of the operations of process flow 1000, any circuitry may perform the operations shown.

At 1010, in some cases, circuitry (e.g., a logic circuit) in first section 1005-*a* may determine that all of the repair cells within first section 1005-*a* are used—i.e., all of the repair cells have been programmed to store electronic data for corresponding defective memory cells. In some cases, it may be determined that all of the repair addresses in first section 1005-*a* have been used during a testing phase, such as by examining the last repair made using a fuse load procedure. In one example, defective memory cells may be identified in the testing process and may be mapped to available repair cells within first section 1005-*a*. If all the repair addresses in first section 1005-*a* are used, the testing phase may also include mapping defective memory cells in first section 1005-*a* to repair cells within another section (e.g., second section 1005-*b*). The testing phase may also include programming first section 1005-*a* with the information that all or some of the repair cells within first section 1005-*a* have been used to repair defective cells (e.g., by blowing fuses). In the testing phase, each memory cell and/or row of memory cells in first section 1005-*a* may be tested to ensure that data is properly stored at those memory cells.

At 1015, first section 1005-*a* and/or second section 1005-*b* may enable a speculative selection operating mode in which access lines in both sections may be selected prior to determining which section will be accessed in response to receiving a memory address. Additionally or alternatively, device memory controller 155-*a* may enable the speculative selection operating mode in sections 1005-*a* and 1005-*b*. In some cases, first section 1005-*a* and/or second section 1005-*b* may enable the speculative selection operating mode based on first section 1005-*a* determining that all of the repairs located in first section 1005-*a* have been used. In other case, first section 1005-*a* and/or second section 1005-*b* may enable the speculative selection operating mode based on determining that another requirement for speculative selection is met. For example, speculative selection may be enabled if a threshold number of repair addresses in first section 1005-*a* are used, if 1005-*b* is a dedicated repair for first section 1005-*a*, if a signal is received from a memory controller, etc.

At 1020, device memory controller 155-*d* may send one or more memory commands to sections 1005-*a* and 1005-*b*, specifying one or more memory addresses to be accessed. In some cases, the one or more memory commands include an activation command, a read command, a write command, and/or a precharge command. In some cases, a memory address may refer to one or more memory cells, and in other cases, a memory address may refer to a section of memory.

At 1025, circuitry (e.g., a logic circuit and decoder) in first section 1005-*a* may select/charge first section 1005-*a*—e.g., first section 1005-*a* may charge one or more digit lines in first section 1005-*a*—in response to receiving a memory command addressed to first section 1005-*a*. First section 1005-*a* may then check a memory address received in the memory command to verify whether the memory address is associated with a valid address or a defective address within first section 1005-*a*. For example, circuitry in first section 1005-*a* may compare the memory address from the command with known defective memory addresses. In some cases, first section 1005-*a* may only compare the memory address with defective memory addresses that correspond to repair addresses of first section 1005-*a*. In other cases, first section 1005-*a* may compare the memory address with defective memory addresses that correspond to repair addresses of sections 1005-*a* and 1005-*b*. If the memory address is valid—i.e., addresses functional memory cells—circuitry within first section 1005-*a* may access the memory cells addressed by the received memory address according to the memory command.

Similarly, at 1030, circuitry (e.g., a logic circuit and decoder) in second section 1005-*b* may select/charge second section 1005-*b*—e.g., charge one or more digit lines in second section 1005-*b*—in response to receiving the memory command addressed to first section 1005-*a* or in response to receiving a signal from first section 1005-*a*. Second section 1005-*b* may then check the address from the memory command to verify whether the memory address is a valid memory address and/or is associated with a repair address within second section 1005-*b*. For example, circuitry in second section 1005-*b* may compare the memory address from the command with known defective memory address. In some cases, second section 1005-*b* may only compare the memory address with defective memory addresses that correspond to repair address of second section 1005-*b*. In other cases, second section 1005-*b* may compare the memory address with defective memory addresses that correspond to repair addresses of first section 1005-*a* and 1005-*b*. In such cases, if second section 1005-*b* determines that the memory address is valid—e.g., by failing to match the received memory address with a known defective memory address of first section 1005-*a* or second section 1005-*b*—circuitry within second section 1005-*b* may discharge second section 1005-*b*—e.g., may discharge the one or more digit lines in second section 1005-*b*.

At 1035, circuitry (e.g., a logic circuit) in first section 1005-*a* may determine that the memory address associated with the memory command is not defective (or valid)—e.g., by failing to match the memory address to a known defective memory address—and may further determine that the valid address is within first section 1005-*a*—e.g., using the address information received in the memory command.

In some examples, at 1040, circuitry (e.g., a logic circuit) in second section 1005-*b* may determine that the memory address associated with the memory command is not defective (or valid)—e.g., by failing to match the memory address to a known defective memory address—and may further determine that the valid address is within first section 1005-*a*—e.g., using the address information in the memory command.

In some cases, at 1045, circuitry (e.g., a logic circuit) in first section 1005-*a* may identify memory cells corresponding to the valid memory address in first section 1005-*a*, and, at 1060, may activate a word line corresponding to the valid address. In some cases, circuitry in first section 1005-*a* may identify the valid address when determining that the memory address from the memory command is not defective (e.g., as a part of 1035). In some examples, at 1055, the circuitry in first section 1005-*a* may indicate that memory cells addressed by the valid address are located in first section 1005-*a*—e.g., may indicate the valid address is located in first section 1005-*a*. After the word line is activated, an access voltage may be applied across one or more memory cells, causing the memory cells to discharge onto respective access lines (e.g., digit lines). The resulting voltages on the access lines (e.g., digit lines) may then be sensed and the information stored in the memory cells may be read—e.g., by a memory controller.

Similarly, at 1050, circuitry (e.g., a logic circuit) in second section 1005-*b* may identify memory cells corresponding to the valid memory address in first section 1005-*a*. In some cases, circuitry in second section 1005-*b* may identify the valid memory address when determining the memory address from the memory command is defective (e.g., as a part of 1040). Accordingly, circuitry in second section 1005-*b* may determine that the memory address points to memory cells in first section 1005-*a*—e.g., based on a section ID/address indicating the first section being included in the memory address.

At 1065, circuitry in second section 1005-*b* may deselect second section 1005-*b*—e.g., remove an applied voltage and/or apply a discharge voltage to one or more charged digit lines in second section 1005-*b*—in response to the indication or the determination of the valid memory address location.

At 1070, first section 1005-*a* may send the requested data to the device memory controller 155-*d*, as indicated in the memory command. For example, voltages discharged onto the access lines (e.g., digit lines) of the repair cells may be sensed and resulting data may be sent to the device memory controller 155-*d*.

Figure 11:
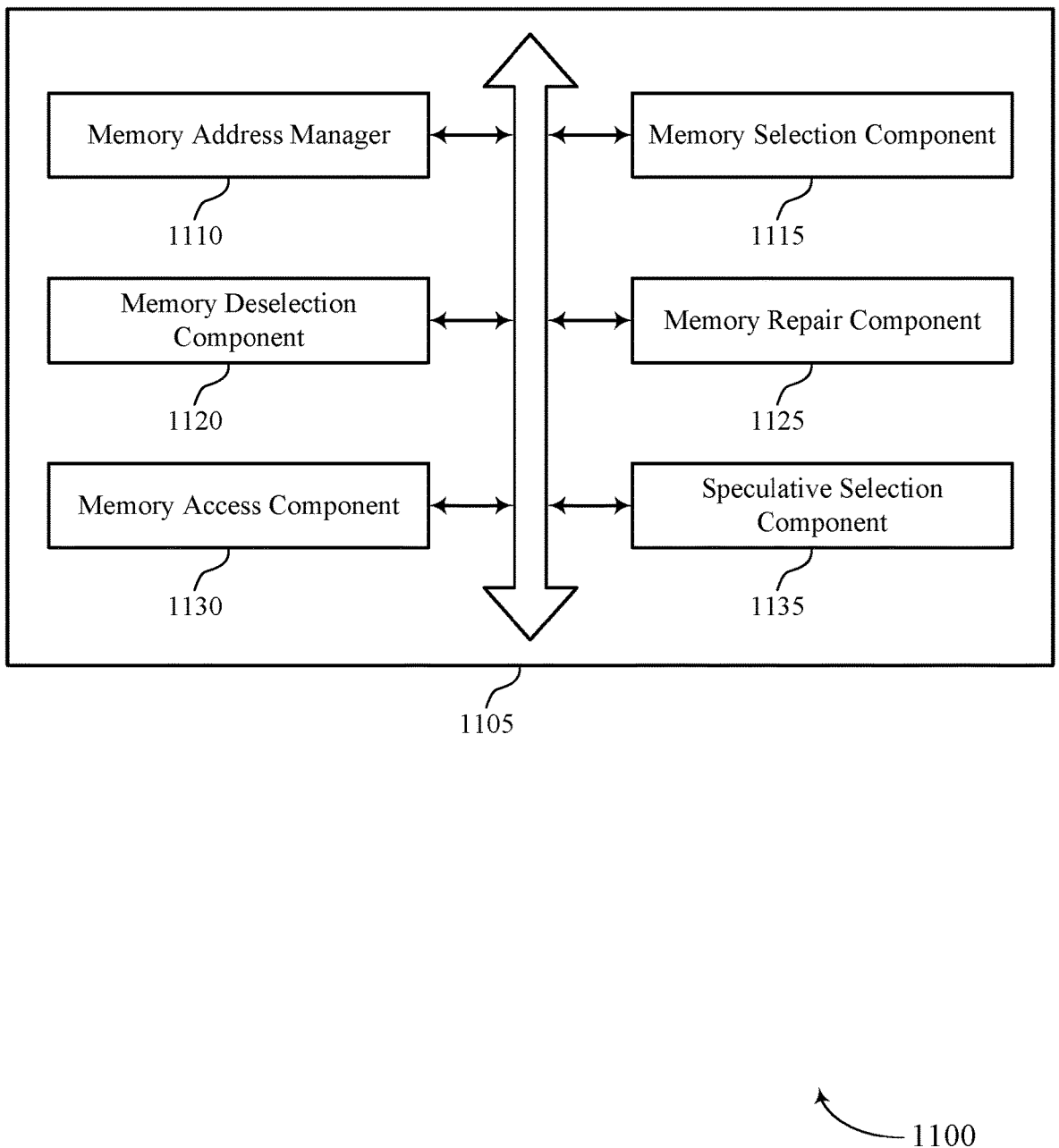
FIG. 11 shows an exemplary memory controller that supports speculative section selection within a memory device in accordance with aspects of the present disclosure.

FIG. 11 shows a block diagram 1100 of a memory controller 1105 that supports speculative section selection within a memory device in accordance with examples as disclosed herein. The memory controller 1105 may be an example of aspects of a memory controller as described with reference to FIGS. 1-10. The memory controller 1105 may include a memory address manager 1110, a memory selection component 1115, a memory deselection component 1120, a memory repair component 1125, a memory access component 1130, and a speculative selection component 1135. Each of these modules may communicate, directly or indirectly, with one another (e.g., via one or more buses).

The memory address manager 1110 may receive a memory address corresponding to memory cells in a first memory section. In some examples, the memory address manager 1110 may receive a second memory address corresponding to second memory cells in the first memory section. In some examples, receiving the memory address includes receiving a memory command that indicates the memory address.

The memory selection component 1115 may select a first access line in the first memory section and a second access line in a second memory section based on receiving the memory address. In some examples, the memory selection component 1115 may select, in each of a set of memory sections, at least one access line based on receiving the memory command. In some examples, the memory selection component 1115 may select the first access line in the first memory section and the second access line in the second memory section based on receiving the second memory address. In some examples, selecting the first access line includes activating a first plate line and a first digit line in the first memory section. In some examples, selecting the second access line includes activating a second plate line and a second digit line in the second memory section.

The speculative selection component 1135 may determine that all repair cells in one memory section of a set of memory sections have been programmed to replace corresponding memory cells in the one memory section of the set of memory sections—e.g., where the set of memory sections includes the first memory section and the second memory section. In some examples, speculative selection component 1135 may configure, based on the determining, each of the set of memory sections to be activated based on memory addresses corresponding to memory cells in the first memory section. In some examples, the speculative selection component 1135 may enable, based on the determining, an operating mode where each of the set of memory sections is configured to be selected based on a second memory address being received at any of the set of memory sections. The speculative selection component 1135 may also determine that a quantity of repair cells in a first memory section of the set of memory sections have been configured to repair defective memory cells in the first memory section and may enable the operating mode based on the determination.

The memory repair component 1125 may identify the repair cells based on the memory address. In some examples, the memory repair component 1125 may compare, based on receiving the memory address, the memory address with addresses of memory cells identified/known as defective. In some examples, the memory repair component 1125 may compare, at least partially concurrently with selecting at least one access line in each of the set of memory sections, the memory address with addresses of defective memory cells. In some examples, the memory repair component 1125 may match the memory address with one of the addresses of defective memory cells, where the location of the repair cells is identified based on the matching. In some cases, the memory repair component 1125 may match the memory address with one of the addresses of the memory cells identified as defective, where identifying the repair cells includes determining an address of the repair cells based on the matching. In some cases, the memory repair component 1125 may identify that the repair cells are located in a second memory section based on the memory address.

In some cases, the memory repair component 1125 may indicate, to the first memory section, that the repair cells are located in the second memory section. Therefore, in some cases, the memory deselection component 1120 may deselect a first access line of the first memory section based on the repair cells being located in the second memory section. In some cases, the memory selection component 1115 may also maintain a selection of a second access line of the second memory section based on the repair cells being located in the second memory section. Further, in some cases, memory selection component 1115 may select, after the first access line is deselected, a third access line in the second memory section that is coupled with the repair cells. In some cases, the indication may cause the memory deselection component 1120 to deselect in each of the other memory sections of the set of memory sections, the at least one access line based on identifying that the repair cells are located in the second memory section.

In some cases, the memory repair component 1125 may indicate, to a second memory section of the set of memory sections, that the repair cells are located in the first memory section. In some cases, the indication may cause the memory selection component 1115 to maintain a selection of a first access line of the first memory section based on the repair cells being located in the first memory section. In some cases, the indication may also cause the memory deselection component 1120 to deselect a second access line of the second memory section based on the repair cells being located in the first memory section. Further, in some cases, memory selection component 1115 may select, after the second access line is deselected, a third access line in the first memory section that is coupled with the repair cells.

The memory deselection component 1120 may deselect one of the first access line or the second access line based on a location of repair cells corresponding to the memory cells, where the repair cells are located in one of the first memory section or the second memory section. In some examples, the memory deselection component 1120 may deselect, in a subset of the set of memory sections, the at least one access line based on a location of repair cells corresponding to the memory cells in the first memory section. In some examples, the memory deselection component 1120 may deselect the second access line based on determining that the second memory cells in the first memory section are not defective. In some examples, the memory deselection component 1120 may deselect a first access line of the first memory section. In some examples, deselecting the first access line includes deactivating the first plate line and the first digit line based on the repair cells being located in the second memory section. In some examples, deselecting the second access line includes deactivating the second plate line and the second digit line based on the repair cells being located in the first memory section.

The memory access component 1130 may access, in the one of the first memory section or the second memory section, the repair cells instead of the memory cells based on identifying that the memory address indicates defective memory cells. In some examples, the memory access component 1130 may activate a first word line in the first memory section after deactivating the second plate line and the second digit line, where the first word line is coupled with first selection devices for the repair cells. In some examples, the memory access component 1130 may activate a second word line in the second memory section after deactivating the first plate line and the first digit line, where the second word line is coupled with second selection devices for the repair cells. The memory access component 1130 may also access, in the one of the first memory section or the second memory section, the memory cells addressed by a memory command based on identifying that the memory address indicates functional memory cells.

Figure 12:
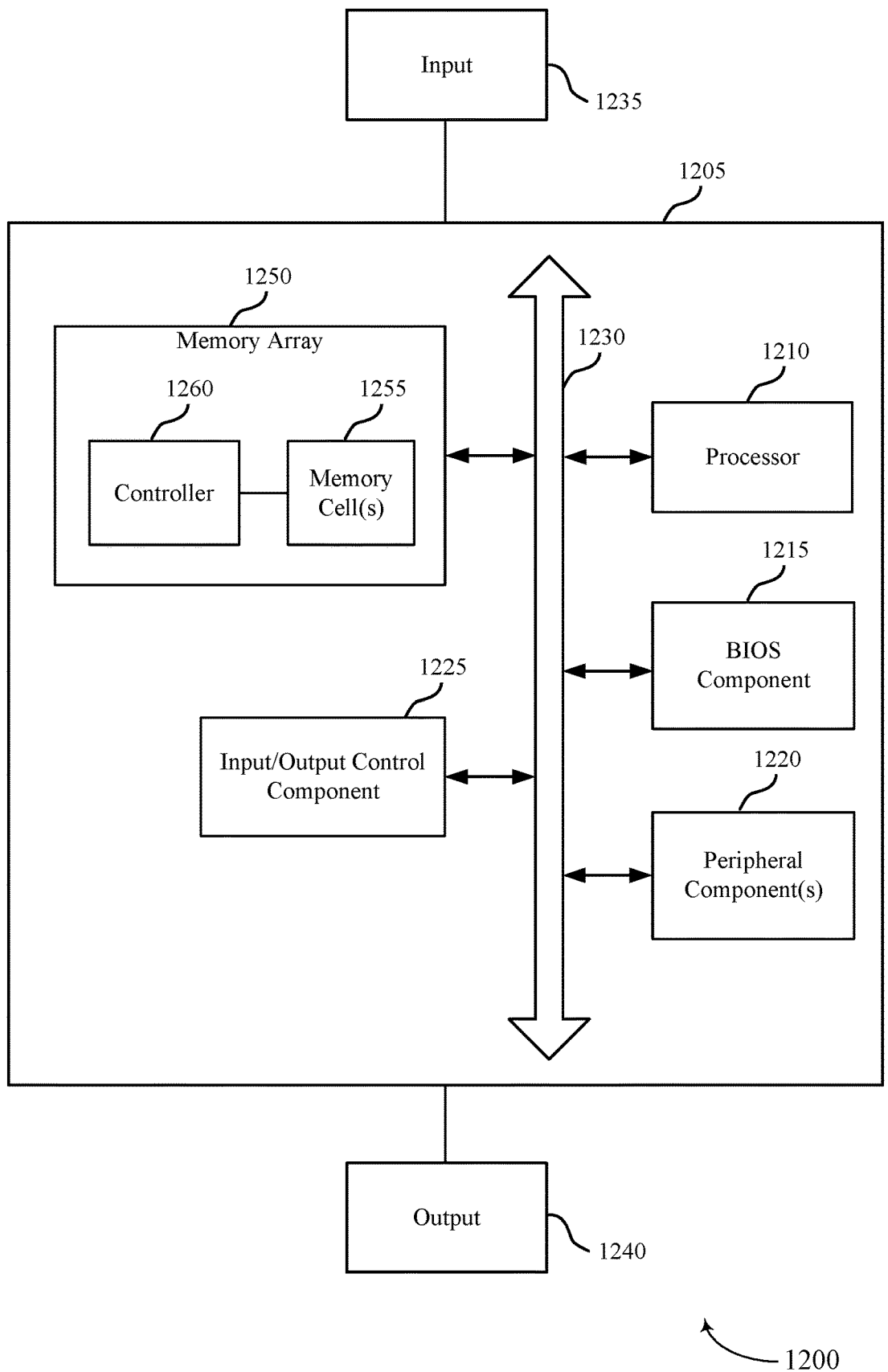
FIG. 12 shows a block diagram of a memory array that supports speculative section selection within a memory device in accordance with aspects of the present disclosure.

FIG. 12 illustrates an example system that supports speculative section selection within a memory device in accordance with aspects of the present disclosure. System 1200 includes a device 1205, which may be or include a printed circuit board to connect or physically support various components. Device 1205 includes a memory array 1250, which may be an example of memory array described with reference to FIGS. 1-4. Memory array 1250 may contain memory controller 1260 and memory cell(s) 1255, which may be examples of memory controller and memory cells described with reference to FIGS. 1-10. Device 1205 may also include a processor 1210, BIOS component 1215, peripheral component(s) 1220, and input/output control component 1225. The components of device 1205 may be in electronic communication with one another through bus 1230.

Processor 1210 may be configured to operate memory array 1250 through memory controller 1260. In some cases, processor 1210 may perform the functions of memory controller 1260 described with reference to FIGS. 1-10. In other cases, memory controller 1260 may be integrated into processor 1210. Processor 1210 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 1210 may perform various functions described herein. Processor 1210 may, for example, be configured to execute computer-readable instructions stored in memory array 1250 to cause device 1205 perform various functions or tasks.

BIOS component 1215 may be a software component that includes a basic input/output system (BIOS) operated as firmware, which may initialize and run various hardware components of system 1200. BIOS component 1215 may also manage data flow between processor 1210 and the various components, e.g., peripheral components 1220, input/output control component 1225, etc. BIOS component 1215 may include a program or software stored in read-only memory (ROM), flash memory, or any other non-volatile memory.

Peripheral component(s) 1220 may be any input or output device, or an interface for such devices, that is integrated into device 1205. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1225 may manage data communication between processor 1210 and peripheral component(s) 1220, input device 1235, or output device 1240. Input/output control component 1225 may also manage peripherals not integrated into device 1205. In some cases, input/output control component 1225 may represent a physical connection or port to the external peripheral.

Input device 1235 may represent a device or signal external to device 1205 that provides input to device 1205 or its components. This may include a user interface or interface with or between other devices. In some cases, input device 1235 may be a peripheral that interfaces with device 1205 via peripheral component(s) 1220 or may be managed by input/output control component 1225.

Output device 1240 may represent a device or signal external to device 1205 configured to receive output from device 1205 or any of its components. Examples of output device 1240 may include a display, audio speakers, a printing device, another processor or printed circuit board, etc. In some cases, output device 1240 may be a peripheral that interfaces with device 1205 via peripheral component(s) 1220 or may be managed by input/output control component 1225.

The components of memory controller 1260, device 1205, and memory array 1250 may be made up of circuitry designed to carry out their functions. This may include various circuit elements, for example, conductive lines, transistors, capacitors, inductors, resistors, amplifiers, or other active or inactive elements, configured to carry out the functions described herein.

Figure 13:
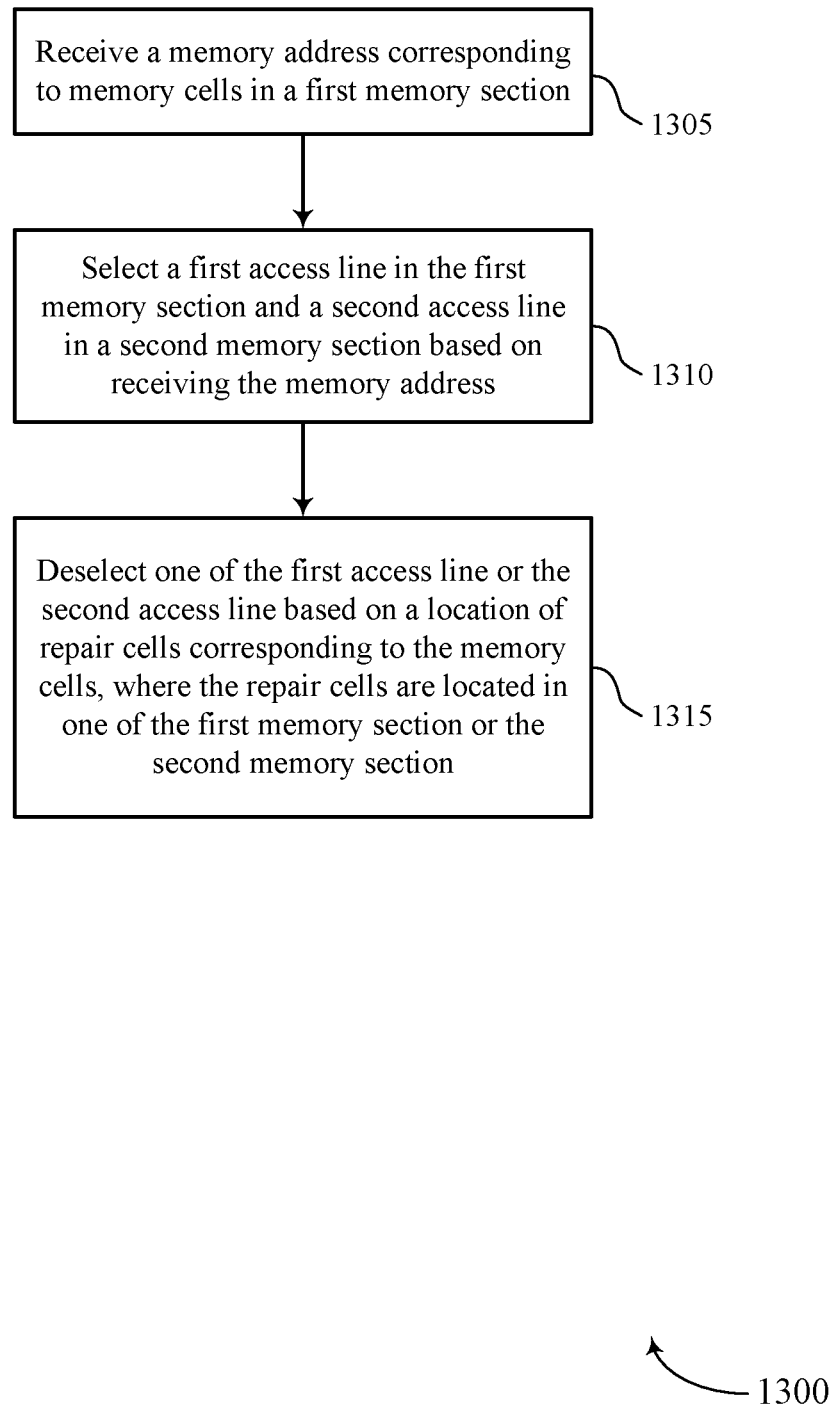
FIGS. 13 through 16 show flowcharts illustrating a method or methods that support speculative section selection within a memory device in accordance with examples as disclosed herein.

FIG. 13 shows a flowchart illustrating a method or methods 1300 that supports speculative section selection within a memory device in accordance with aspects of the present disclosure. The operations of method 1300 may be implemented by a memory array or its components as described herein. For example, the operations of method 1300 may be performed by a memory array as described with reference to FIG. 12. In some examples, a memory array may execute a set of instructions to control the functional elements of the memory array to perform the described functions. Additionally or alternatively, a memory array may perform aspects of the described functions using special-purpose hardware.

At 1305, the memory array may receive a memory address corresponding to memory cells in a first memory section. The operations of 1305 may be performed according to the methods described herein. In some examples, aspects of the operations of 1305 may be performed by a memory array as described with reference to FIG. 12.

At 1310, the memory array may select a first access line in the first memory section and a second access line in a second memory section based on receiving the memory address. The operations of 1310 may be performed according to the methods described herein. In some examples, aspects of the operations of 1310 may be performed by a memory array as described with reference to FIG. 12.

At 1315, the memory array may deselect one of the first access line or the second access line based on a location of repair cells corresponding to the memory cells, where the repair cells are located in one of the first memory section or the second memory section. The operations of 1315 may be performed according to the methods described herein. In some examples, aspects of the operations of 1315 may be performed by a memory array as described with reference to FIG. 12.

In some examples, an apparatus as described herein may perform a method or methods, such as the method 1300. The apparatus may include features, means, or instructions (e.g., a non-transitory computer-readable medium storing instructions executable by a processor) for receiving a memory address corresponding to memory cells in a first memory section, selecting a first access line in the first memory section and a second access line in a second memory section based on receiving the memory address, and deselecting one of the first access line or the second access line based on a location of repair cells corresponding to the memory cells, where the repair cells are located in one of the first memory section or the second memory section.

Some examples of the method 1300 and the apparatus described herein may further include operations, features, means, or instructions for identifying the repair cells based on the memory address, and accessing, in the one of the first memory section or the second memory section, the repair cells instead of the memory cells based on the identifying.

Some examples of the method 1300 and the apparatus described herein may further include operations, features, means, or instructions for comparing, based on receiving the memory address, the memory address with addresses of memory cells identified as defective, and matching the memory address with one of the addresses of the memory cells identified as defective, where identifying the repair cells includes determining an address of the repair cells based on the matching.

Some examples of the method 1300 and the apparatus described herein may further include operations, features, means, or instructions for indicating, to the second memory section, that the repair cells may be located in the first memory section, where the second access line is deselected based on the indicating and accessing the repair cells includes selecting, after the second access line is deselected, a third access line in the first memory section that is coupled with the repair cells.

Some examples of the method 1300 and the apparatus described herein may further include operations, features, means, or instructions for indicating, to the first memory section, that the repair cells may be located in the second memory section, where the first access line is deselected based on the indicating and accessing the repair cells includes selecting, after the first access line is deselected, a third access line in the second memory section that is coupled with the repair cells.

Some examples of the method 1300 and the apparatus described herein may further include operations, features, means, or instructions for determining that all repair cells in one of a set of memory sections may have been programmed to replace corresponding memory cells in the one of the set of memory sections, where the set of memory sections includes the first memory section and the second memory section, and enabling, based on the determining, an operating mode where each of the set of memory sections may be configured to be selected based on a second memory address of one of the set of memory sections being received at any of the set of memory sections.

Some examples of the method 1300 and the apparatus described herein may further include operations, features, means, or instructions for receiving a second memory address corresponding to second memory cells in the first memory section, selecting the first access line in the first memory section and the second access line in the second memory section based on receiving the second memory address, and deselecting the second access line based on determining that the second memory cells in the first memory section may be not defective.

In some examples of the method 1300 and the apparatus described herein, selecting the first access line may include operations, features, means, or instructions for activating a first plate line and a first digit line in the first memory section, and selecting the second access line may include operations, features, means, or instructions for activating a second plate line and a second digit line in the second memory section.

In some examples of the method 1300 and the apparatus described herein, deselecting the first access line may include operations, features, means, or instructions for deactivating the first plate line and the first digit line based on the repair cells being located in the second memory section, or, and deselecting the second access line may include operations, features, means, or instructions for deactivating the second plate line and the second digit line based at least in the repair cells being located in the first memory section.

In some examples of the method 1300 and the apparatus described herein, accessing the repair cells in one of the first memory section or the second memory section may include operations, features, means, or instructions for activating a first word line in the first memory section after deactivating the second plate line and the second digit line, where the first word line may be coupled with first selection devices for the repair cells, or, and activating a second word line in the second memory section after deactivating the first plate line and the first digit line, where the second word line may be coupled with second selection devices for the repair cells.

In some examples of the method 1300 and the apparatus described herein, receiving the memory address may include operations, features, means, or instructions for receiving a memory command that indicates the memory address.

Figure 14:
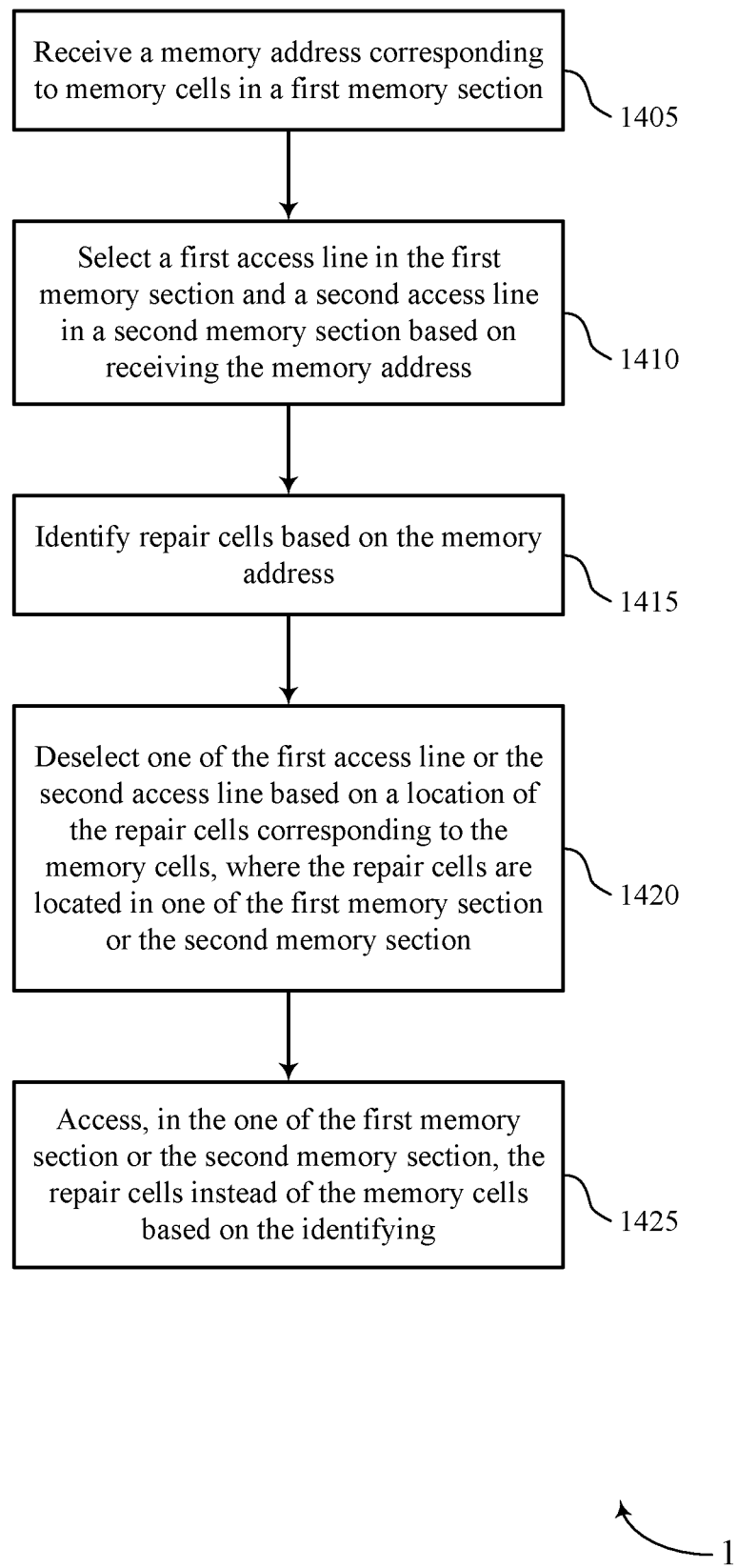

FIG. 14 shows a flowchart illustrating a method or methods 1400 that supports speculative section selection within a memory device in accordance with aspects of the present disclosure. The operations of method 1400 may be implemented by a memory array or its components as described herein. For example, the operations of method 1400 may be performed by a memory array as described with reference to FIG. 12. In some examples, a memory array may execute a set of instructions to control the functional elements of the memory array to perform the described functions. Additionally or alternatively, a memory array may perform aspects of the described functions using special-purpose hardware.

At 1405, the memory array may receive a memory address corresponding to memory cells in a first memory section. The operations of 1405 may be performed according to the methods described herein. In some examples, aspects of the operations of 1405 may be performed by a memory array as described with reference to FIG. 12.

At 1410, the memory array may select a first access line in the first memory section and a second access line in a second memory section based on receiving the memory address. The operations of 1410 may be performed according to the methods described herein. In some examples, aspects of the operations of 1410 may be performed by a memory array as described with reference to FIG. 12.

At 1415, the memory array may identify the repair cells based on the memory address. The operations of 1415 may be performed according to the methods described herein. In some examples, aspects of the operations of 1415 may be performed by a memory array as described with reference to FIG. 12.

At 1420, the memory array may deselect one of the first access line or the second access line based on a location of repair cells corresponding to the memory cells, where the repair cells are located in one of the first memory section or the second memory section. The operations of 1420 may be performed according to the methods described herein. In some examples, aspects of the operations of 1420 may be performed by a memory array as described with reference to FIG. 12.

At 1425, the memory array may access, in the one of the first memory section or the second memory section, the repair cells instead of the memory cells based on the identifying. The operations of 1425 may be performed according to the methods described herein. In some examples, aspects of the operations of 1425 may be performed by a memory array as described with reference to FIG. 12.

Figure 15:
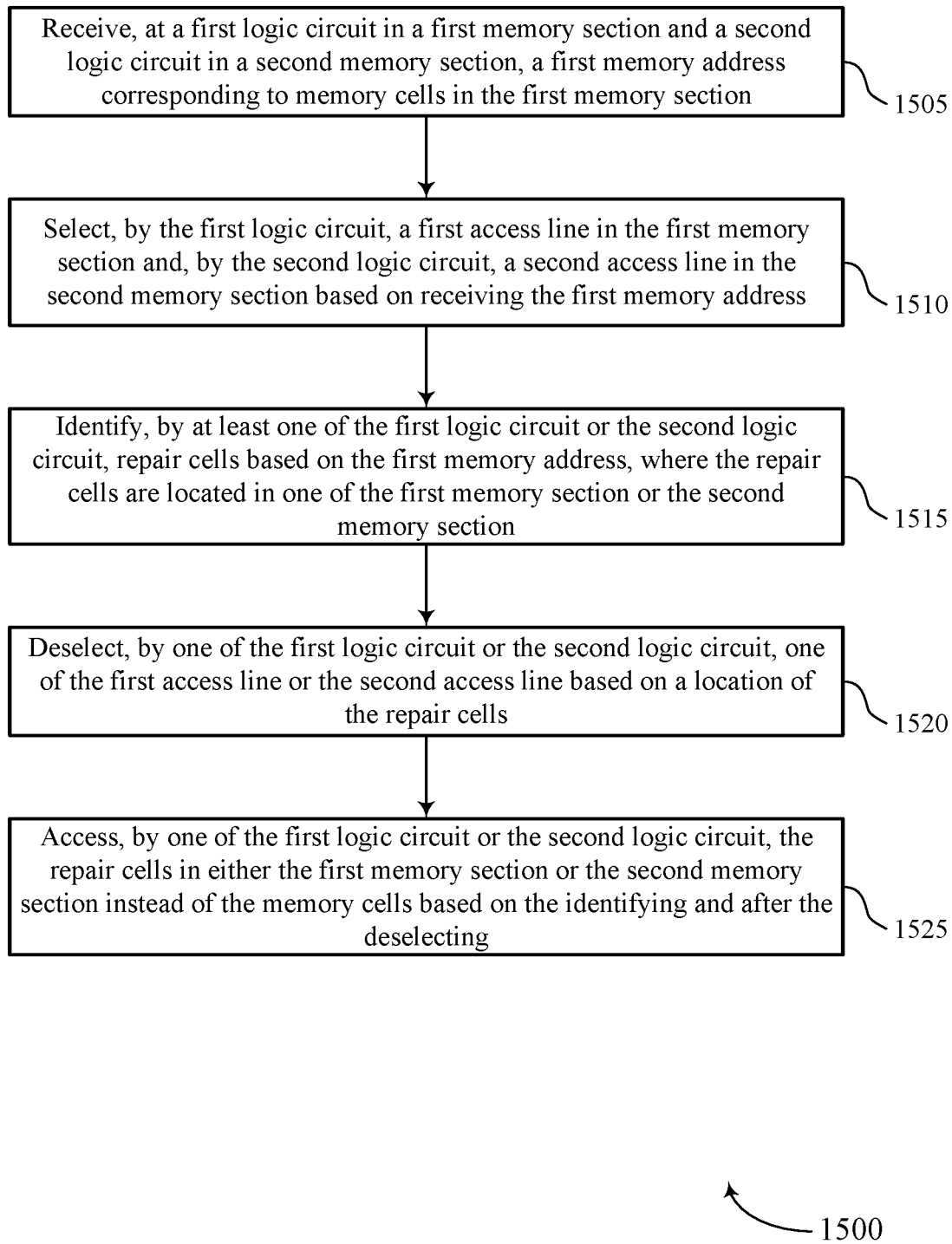

FIG. 15 shows a flowchart illustrating a method or methods 1500 that supports speculative section selection within a memory device in accordance with aspects of the present disclosure. The operations of method 1500 may be implemented by a memory array or its components as described herein. For example, the operations of method 1500 may be performed by a memory array as described with reference to FIG. 12. In some examples, a memory array may execute a set of instructions to control the functional elements of the memory array to perform the described functions. Additionally or alternatively, a memory array may perform aspects of the described functions using special-purpose hardware.

At 1505, the memory array may receive, at a first logic circuit in a first memory section and a second logic circuit in a second memory section, a first memory address corresponding to memory cells in the first memory section. The operations of 1505 may be performed according to the methods described herein. In some examples, aspects of the operations of 1505 may be performed by a memory array as described with reference to FIG. 12.

At 1510, the memory array may select, by the first logic circuit, a first access line in the first memory section and, by the second logic circuit, a second access line in the second memory section based on receiving the first memory address. The operations of 1510 may be performed according to the methods described herein. In some examples, aspects of the operations of 1510 may be performed by a memory array as described with reference to FIG. 12.

At 1515, the memory array may identify, by at least one of the first logic circuit or the second logic circuit, repair cells based on the first memory address, where the repair cells are located in one of the first memory section or the second memory section. The operations of 1515 may be performed according to the methods described herein. In some examples, aspects of the operations of 1515 may be performed by a memory array as described with reference to FIG. 12.

At 1520, the memory array may deselect, by one of the first logic circuit or the second logic circuit, one of the first access line or the second access line based on a location of the repair cells. The operations of 1520 may be performed according to the methods described herein. In some examples, aspects of the operations of 1520 may be performed by a memory array as described with reference to FIG. 12.

At 1525, the memory array may access, by one of the first logic circuit or the second logic circuit, the repair cells in either the first memory section or the second memory section instead of the memory cells based on the identifying and after the deselecting. The operations of 1525 may be performed according to the methods described herein. In some examples, aspects of the operations of 1525 may be performed by a memory array as described with reference to FIG. 12.

In some examples, an apparatus as described herein may perform a method or methods, such as the method 1500. The apparatus may include features, means, or instructions (e.g., a non-transitory computer-readable medium storing instructions executable by a processor) for receiving, at a first logic circuit in a first memory section and a second logic circuit in a second memory section, a first memory address corresponding to memory cells in the first memory section, selecting, by the first logic circuit, a first access line in the first memory section and, by the second logic circuit, a second access line in the second memory section based on receiving the first memory address, identifying, by at least one of the first logic circuit or the second logic circuit, repair cells based on the first memory address, where the repair cells are located in one of the first memory section or the second memory section, deselecting, by one of the first logic circuit or the second logic circuit, one of the first access line or the second access line based on a location of the repair cells, and accessing, by one of the first logic circuit or the second logic circuit, the repair cells in either the first memory section or the second memory section instead of the memory cells based on the identifying and after the deselecting.

Some examples of the method 1500 and the apparatus described herein may further include operations, features, means, or instructions for comparing, by the first logic circuit, the first memory address with first memory addresses identified as defective and, by the second logic circuit, the first memory address with second memory addresses identified as defective based on receiving the first memory address.

Some examples of the method 1500 and the apparatus described herein may further include operations, features, means, or instructions for determining, by the first logic circuit, a match between the first memory address and a memory address of the first memory addresses identified as defective, where the repair cells may be identified by the first logic circuit as being located in the first memory section based on the determining, and indicating, by the first logic circuit to the second logic circuit, that the repair cells may be located in the first memory section, where the second access line may be deselected by the second logic circuit based on the indicating, and where the repair cells in the first memory section may be accessed by the first logic circuit after the second access line may be deselected.

Some examples of the method 1500 and the apparatus described herein may further include operations, features, means, or instructions for determining, by the second logic circuit, a match between the first memory address and a memory address of the second memory addresses identified as defective, the repair cells may be identified by the second logic circuit as being located in the second memory section based on the determining, and indicating, by the second logic circuit to the first logic circuit, that the repair cells may be located in the second memory section, where the first access line may be deselected by the first logic circuit based on the indicating; and where the repair cells in the second memory section may be accessed by the second logic circuit after the first access line may be deselected.

Some examples of the method 1500 and the apparatus described herein may further include operations, features, means, or instructions for determining, by the first logic circuit, a match between the first memory address and a memory address of the first memory addresses identified as defective, where the repair cells may be identified by the first logic circuit as being located in the first memory section based on the determining, and failing to determine, by the second logic circuit, a match between the first memory address and the second memory addresses identified as defective, where the second access line may be deselected by the second logic circuit based on failing to determine the match between the first memory address with one of the second memory addresses identified as defective.

Some examples of the method 1500 and the apparatus described herein may further include operations, features, means, or instructions for comparing, by the first logic circuit and the second logic circuit, the first memory address with memory addresses identified as defective based on receiving the first memory address, determining, by the first logic circuit and the second logic circuit, a match between the first memory address with a memory address of the memory addresses identified as defective based on the comparing, and identifying, by the first logic circuit and the second logic circuit, a second memory address of the repair cells based on the determining, where the second memory address indicates that the repair cells may be located in the second memory section, and where the first access line may be deselected by the first logic circuit based on the determining.

In some examples of the method 1500 and the apparatus described herein, selecting the first access line and the second access line may include operations, features, means, or instructions for transmitting, by the first logic circuit, a first signal to a first decoding circuit in the first memory section based on receiving the first memory address, where the first decoding circuit activates the first access line based on receiving the first signal, and transmitting, by the second logic circuit, a second signal to a second decoding circuit in the second memory section based on receiving the first memory address, where the second decoding circuit activates the second access line based on receiving the second signal.

In some examples of the method 1500 and the apparatus described herein, deselecting one of the first access line or the second access line may include operations, features, means, or instructions for transmitting, by the first logic circuit, a third signal to the second decoding circuit, where the second decoding circuit deactivates the second access line based on receiving the third signal, or, and transmitting, by the second logic circuit, a fourth signal to the first decoding circuit, where the first decoding circuit deactivates the first access line based on receiving the fourth signal.

In some examples of the method 1500 and the apparatus described herein, accessing the repair cells may include operations, features, means, or instructions for transmitting, by the first logic circuit, a fifth signal to a third decoding circuit in the first memory section after the second access line may be disabled, where the third decoding circuit activates a third access line that may be coupled with the first access line and the repair cells, or, and transmitting, by the second logic circuit, a sixth signal to a fourth decoding circuit in the second memory section after the first access line may be disabled, where the fourth decoding circuit activates a fourth access line that may be coupled with the second access line and the repair cells.

Figure 16:
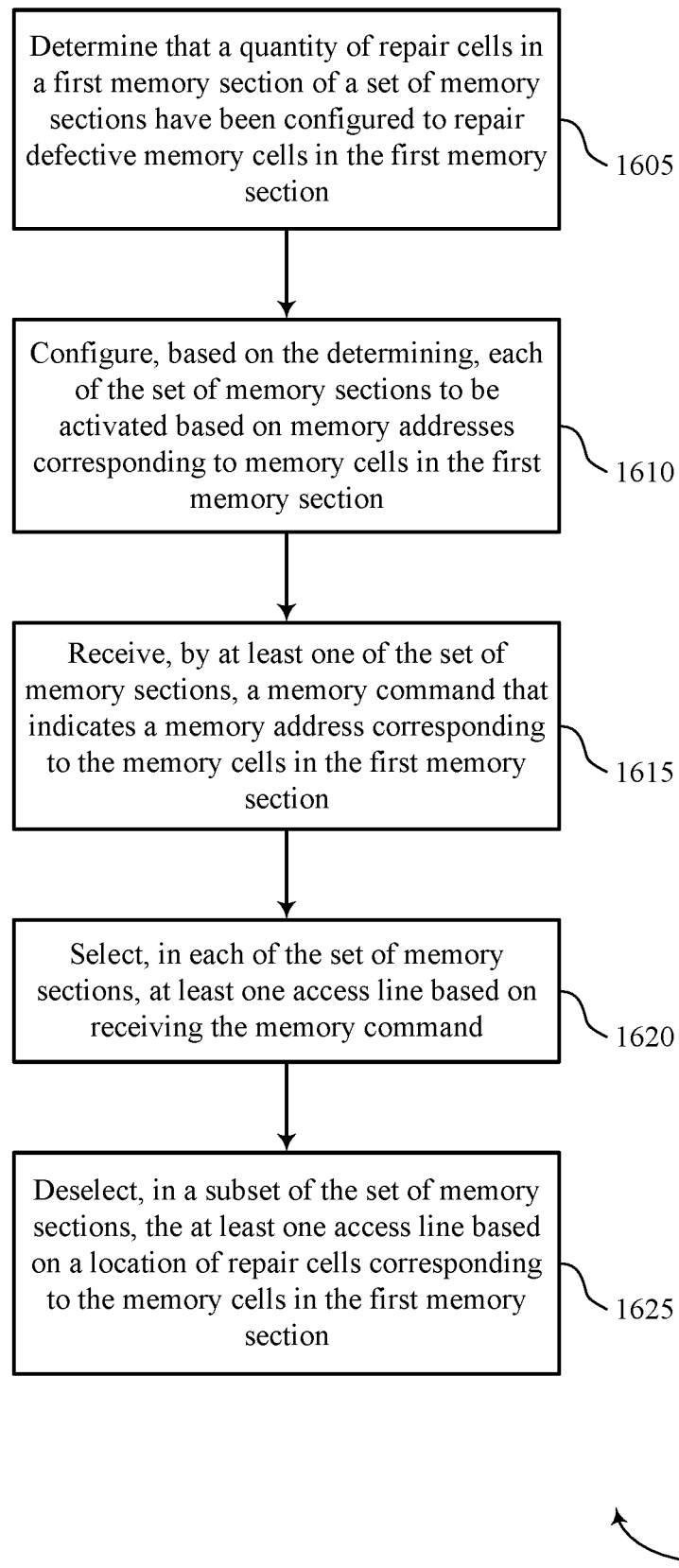

FIG. 16 shows a flowchart illustrating a method or methods 1600 that supports speculative section selection within a memory device in accordance with aspects of the present disclosure. The operations of method 1600 may be implemented by a memory array or its components as described herein. For example, the operations of method 1600 may be performed by a memory array as described with reference to FIG. 12. In some examples, a memory array may execute a set of instructions to control the functional elements of the memory array to perform the described functions. Additionally or alternatively, a memory array may perform aspects of the described functions using special-purpose hardware.

At 1605, the memory array may determine that a quantity of repair cells in a first memory section of a set of memory sections have been configured to repair defective memory cells in the first memory section. The operations of 1605 may be performed according to the methods described herein. In some examples, aspects of the operations of 1605 may be performed by a memory array as described with reference to FIG. 12.

At 1610, the memory array may configure, based on the determining, each of the set of memory sections to be activated based on memory addresses corresponding to memory cells in the first memory section. The operations of 1610 may be performed according to the methods described herein. In some examples, aspects of the operations of 1610 may be performed by a memory array as described with reference to FIG. 12.

At 1615, the memory array may receive, by at least one memory section of the set of memory sections, a memory command that indicates a memory address corresponding to the memory cells in the first memory section. The operations of 1615 may be performed according to the methods described herein. In some examples, aspects of the operations of 1615 may be performed by a memory array as described with reference to FIG. 12.

At 1620, the memory array may select, in each of the set of memory sections, at least one access line based on receiving the memory command. The operations of 1620 may be performed according to the methods described herein. In some examples, aspects of the operations of 1620 may be performed by a memory array as described with reference to FIG. 12.

At 1625, the memory array may deselect, in a subset of the set of memory sections, the at least one access line based on a location of repair cells corresponding to the memory cells in the first memory section. The operations of 1625 may be performed according to the methods described herein. In some examples, aspects of the operations of 1625 may be performed by a memory array as described with reference to FIG. 12.

In some examples, an apparatus as described herein may perform a method or methods, such as the method 1600. The apparatus may include features, means, or instructions (e.g., a non-transitory computer-readable medium storing instructions executable by a processor) for determining that a quantity of repair cells in a first memory section of a set of memory sections have been configured to repair defective memory cells in the first memory section, configuring, based on the determining, each of the set of memory sections to be activated based on memory addresses corresponding to memory cells in the first memory section, receiving, by at least one of the set of memory sections, a memory command that indicates a memory address corresponding to the memory cells in the first memory section, selecting, in each of the set of memory sections, at least one access line based on receiving the memory command, and deselecting, in a subset of the set of memory sections, the at least one access line based on a location of repair cells corresponding to the memory cells in the first memory section.

In some examples of the method 1600 and the apparatus described herein, the set of memory sections may include operations, features, means, or instructions for deselecting a first access line of the first memory section, and maintaining a selection of a second access line of the second memory section.

In some examples of the method 1600 and the apparatus described herein, the set of memory sections may include operations, features, means, or instructions for deselecting a first access line of the first memory section, and maintaining a selection of a second access line of the second memory section.

Some examples of the method 1600 and the apparatus described herein may further include operations, features, means, or instructions for identifying that the repair cells may be located in a second memory section based on the memory address, where deselecting the at least one access line includes deselecting, in each of the other memory sections of the plurality of memory sections, the at least one access line based on identifying that the repair cells are located in the second memory section.

Some examples of the method 1600 and the apparatus described herein may further include operations, features, means, or instructions for comparing, at least partially concurrently with selecting at least one access line in each of the set of memory sections, the memory address with addresses of defective memory cells, and matching the memory address with one of the addresses of defective memory cells, where the location of the repair cells may be identified based on the matching.

Some examples of the method 1600 and the apparatus described herein may further include operations, features, means, or instructions for indicating, to the first memory section, that the repair cells may be located in the second memory section, where deselecting the at least one access line includes deselecting a first access line of the first memory section based on the repair cells being located in the second memory section and maintaining a selection of a second access line of the second memory section based on the repair cells being located in the second memory section.

Some examples of the method 1600 and the apparatus described herein may further include operations, features, means, or instructions for indicating, to a second memory section of the set of memory sections, that the repair cells may be located in the first memory section, where deselecting the at least one access line includes maintaining a selection of a first access line of the first memory section based on the repair cells being located in the first memory section and deselecting a second access line of the second memory section based on the repair cells being located in the first memory section.

It should be noted that the methods described above describe possible implementations, and that the operations and the steps may be rearranged or otherwise modified and that other implementations are possible. Furthermore, portions from two or more of the methods may be combined.

An apparatus is described. In some cases, the apparatus may be used to perform or to support the performance of aspects of the methods described herein. The apparatus may include a first memory section including a first access line, first memory cells coupled with the first access line, and a first decoding circuit configured to select the first access line based on a received memory address corresponding to the first memory section, a second memory section including a second access line and a second decoding circuit configured to select the second access line based on the received memory address corresponding to the first memory section, and where the first decoding circuit is further configured to deselect the first access line based on a location of repair cells for the first memory cells being in the second memory section.

In some examples, the first memory section further includes a first logic circuit configured to compare received memory addresses with a first set of memory addresses for defective memory cells, and the second memory section further includes a second logic circuit configured to compare received memory addresses with a second set of memory addresses for defective memory cells.

Some examples of the apparatus may include a first signal path configured to convey, between the first logic circuit and the second decoding circuit, a first indication of whether the received memory address matches one of the first set of memory addresses for defective memory cells, where the second decoding circuit may be configured to deselect the second access line based on the first indication, and a second signal path configured to convey, between the second logic circuit and the first decoding circuit, a second indication of whether the received memory address matches one of the second set of memory addresses for defective memory cells, where the first decoding circuit may be configured to deselect the first access line based on the second indication.

In some examples, the first memory section further includes first repair cells, where the first access line may be coupled with the first memory cells and the first repair cells, and the second memory section further includes second memory cells and second repair cells, where the second access line may be coupled with the second memory cells and the second repair cells.

In some examples, the first memory section further includes a third access line coupled with the first repair cells and a third decoding circuit configured to select the third access line based on whether the received memory address matches one of the first set of memory addresses for defective memory cells, and the second memory section further includes a fourth access line coupled with the second repair cells and a fourth decoding circuit configured to select the fourth access line based on whether the received memory address matches one of the second set of memory addresses for defective memory cells.

Some examples of the apparatus may include a group of memory sections configured to each be selected when a memory address of one memory section of the group of memory sections may be received at any one or more memory sections of the group of memory sections, where the group of memory sections includes the first memory section and the second memory section.

In some examples, the second memory section includes second memory cells, each of the second memory cells programmed to repair a defective memory cell in another memory section.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
receiving a memory address corresponding to memory cells in a first memory section;
selecting a first access line in the first memory section and a second access line in a second memory section based at least in part on receiving the memory address;
identifying that repair cells corresponding to the memory cells are located in the first memory section;
indicating, to the second memory section, that the repair cells are located in the first memory section;
deselecting the second access line based at least in part on the location of the repair cells; and
accessing, in the first memory section, the repair cells instead of the memory cells based at least in part on identifying the repair cells, wherein accessing the repair cells comprises selecting, after the second access line is deselected, a third access line in the first memory section that is coupled with the repair cells.

2. The method of claim 1, further comprising:
comparing, based at least in part on receiving the memory address, the memory address with addresses of memory cells identified as defective; and
matching the memory address with one of the addresses of the memory cells identified as defective, wherein identifying the repair cells comprises:
determining an address of the repair cells based at least in part on the matching.

3. A method, comprising:
receiving a memory address corresponding to memory cells in a first memory section;
selecting a first access line in the first memory section and a second access line in a second memory section based at least in part on receiving the memory address identifying that repair cells corresponding to the memory cells are located in the second memory section;
indicating, to the first memory section, that the repair cells are located in the second memory section;
deselecting the first access line based at least in part on the location of the repair cells; and
accessing, in the second memory section, the repair cells instead of the memory cells based at least in part on identifying the repair cells, wherein
accessing the repair cells comprises selecting, after the first access line is deselected, a third access line in the second memory section that is coupled with the repair cells.

4. The method of claim 1, further comprising:
determining that all repair cells in one of a plurality of memory sections have been programmed to replace corresponding memory cells in the one of the plurality of memory sections, wherein the plurality of memory sections comprises the first memory section and the second memory section; and
enabling, based at least in part on the determining, an operating mode wherein each of the plurality of memory sections is configured to be selected based at least in part on a second memory address of one of the plurality of memory sections being received at any of the plurality of memory sections.

5. The method of claim 1, further comprising:
receiving a second memory address corresponding to second memory cells in the first memory section;
selecting the first access line in the first memory section and the second access line in the second memory section based at least in part on receiving the second memory address; and
deselecting the second access line based at least in part on determining that the second memory cells in the first memory section are not defective.

6. A method, comprising:
receiving a memory address corresponding to memory cells in a first memory section;
selecting a first access line in the first memory section and a second access line in a second memory section based at least in part on receiving the memory address, wherein:
selecting the first access line comprises activating a first plate line and a first digit line in the first memory section, and
selecting the second access line comprises activating a second plate line and a second digit line in the second memory section; and
deselecting the second access line based at least in part on a location of repair cells corresponding to the memory cells, wherein the repair cells are located in one of the first memory section or the second memory section.

7. The method of claim 6, wherein:
deselecting the first access line comprises deactivating the first plate line and the first digit line based at least in part on the repair cells being located in the second memory section, or
deselecting the second access line comprises deactivating the second plate line and the second digit line based at least in the repair cells being located in the first memory section.

8. The method of claim 7, wherein accessing the repair cells in one of the first memory section or the second memory section comprises:
activating a first word line in the first memory section after deactivating the second plate line and the second digit line, wherein the first word line is coupled with first selection devices for the repair cells, or
activating a second word line in the second memory section after deactivating the first plate line and the first digit line, wherein the second word line is coupled with second selection devices for the repair cells.

9. The method of claim 1, wherein receiving the memory address comprises receiving a memory command that indicates the memory address.

10. A method, comprising:
determining that a quantity of repair cells in a first memory section of a plurality of memory sections have been configured to repair defective memory cells in the first memory section;
configuring, based at least in part on the determining, each of the plurality of memory sections to be activated based at least in part on memory addresses corresponding to memory cells in the first memory section;
receiving, by at least one of the plurality of memory sections, a memory command that indicates a memory address corresponding to the memory cells in the first memory section;
selecting, in each of the plurality of memory sections, at least one access line based at least in part on receiving the memory command;
comparing, at least partially concurrently with selecting at least one access line in each of the plurality of memory sections, the memory address with addresses of defective memory cells;

matching the memory address with one of the addresses of defective memory cells; and deselecting, in a subset of the plurality of memory sections, the at least one access line based at least in part on a location of repair cells corresponding to the memory cells in the first memory section, wherein the location of the repair cells is identified based at least in part on matching the memory address with one of the addresses of defective memory cells.

11. The method of claim 10, wherein the plurality of memory sections comprises the first memory section and a second memory section that is dedicated to repair cells, wherein the repair cells corresponding to the memory cells are located in the second memory section, and wherein deselecting the at least one access line comprises:
deselecting a first access line of the first memory section; and
maintaining a selection of a second access line of the second memory section.

12. The method of claim 10, wherein the plurality of memory sections comprises the first memory section and a second memory section immediately adjacent to the first memory section, wherein the repair cells corresponding to the memory cells are located in the second memory section, and wherein deselecting the at least one access line comprises:
deselecting a first access line of the first memory section; and
maintaining a selection of a second access line of the second memory section.

13. The method of claim 10, further comprising:
identifying that the repair cells are located in a second memory section based at least in part on the memory address, wherein deselecting the at least one access line comprises:
deselecting, in each of the other memory sections of the plurality of memory sections, the at least one access line based at least in part on identifying that the repair cells are located in the second memory section.

14. The method of claim 10, wherein the repair cells are identified as being located in a second memory section of the plurality of memory sections, the method further comprising:
indicating, to the first memory section, that the repair cells are located in the second memory section, wherein deselecting the at least one access line comprises:
deselecting a first access line of the first memory section based at least in part on the repair cells being located in the second memory section; and
maintaining a selection of a second access line of the second memory section based at least in part on the repair cells being located in the second memory section.

15. The method of claim 10, wherein the repair cells are identified as being located in the first memory section, the method further comprising:
indicating, to a second memory section of the plurality of memory sections, that the repair cells are located in the first memory section, wherein deselecting the at least one access line comprises:
maintaining a selection of a first access line of the first memory section based at least in part on the repair cells being located in the first memory section; and
deselecting a second access line of the second memory section based at least in part on the repair cells being located in the first memory section.

16. An apparatus, comprising:
a group of memory sections configured to each be selected when a memory address of one of the group of memory sections is received at any one or more of the group of memory sections, the group of memory sections comprising:
a first memory section comprising a first access line, first memory cells coupled with the first access line, and a first decoding circuit configured to select the first access line based at least in part on a received memory address corresponding to the first memory section; and
a second memory section comprising a second access line and a second decoding circuit configured to select the second access line based at least in part on the received memory address corresponding to the first memory section,
wherein the first decoding circuit is further configured to deselect the first access line based at least in part on a location of repair cells for the first memory cells being in the second memory section.

17. An apparatus, comprising:
a first memory section comprising a first access line, first memory cells coupled with the first access line, a first decoding circuit configured to select the first access line based at least in part on a received memory address corresponding to the first memory section, and a first logic circuit configured to compare received memory addresses with a first plurality of memory addresses for defective memory cells, and
a second memory section comprising a second access line, a second decoding circuit configured to select the second access line based at least in part on the received memory address corresponding to the first memory section, and a second logic circuit configured to compare received memory addresses with a second plurality of memory addresses for defective memory cells,
wherein the first decoding circuit is further configured to deselect the first access line based at least in part on a location of repair cells for the first memory cells being in the second memory section.

18. The apparatus of claim 17, further comprising:
a first signal path configured to convey, between the first logic circuit and the second decoding circuit, a first indication of whether the received memory address matches one of the first plurality of memory addresses for defective memory cells, wherein the second decoding circuit is configured to deselect the second access line based at least in part on the first indication; and
a second signal path configured to convey, between the second logic circuit and the first decoding circuit, a second indication of whether the received memory address matches one of the second plurality of memory addresses for defective memory cells, wherein the first decoding circuit is configured to deselect the first access line based at least in part on the second indication.

19. The apparatus of claim 17, wherein:
the first memory section further comprises first repair cells, wherein the first access line is coupled with the first memory cells and the first repair cells, and
the second memory section further comprises second memory cells and second repair cells, wherein the second access line is coupled with the second memory cells and the second repair cells.

20. The apparatus of claim 19, wherein:

the first memory section further comprises a third access line coupled with the first repair cells and a third decoding circuit configured to select the third access line based at least in part on whether the received memory address matches one of the first plurality of memory addresses for defective memory cells, and the second memory section further comprises a fourth access line coupled with the second repair cells and a fourth decoding circuit configured to select the fourth access line based at least in part on whether the received memory address matches one of the second plurality of memory addresses for defective memory cells.

21. The apparatus of claim 16, wherein the second memory section comprises second memory cells, each of the second memory cells programmed to repair a defective memory cell in another memory section.

22. The method of claim 3, further comprising:

comparing, based at least in part on receiving the memory address, the memory address with addresses of memory cells identified as defective; and matching the memory address with one of the addresses of the memory cells identified as defective, wherein identifying the repair cells comprises:

determining an address of the repair cells based at least in part on the matching.

23. The method of claim 3, further comprising:

determining that all repair cells in one of a plurality of memory sections have been programmed to replace corresponding memory cells in the one of the plurality of memory sections, wherein the plurality of memory sections comprises the first memory section and the second memory section; and enabling, based at least in part on the determining, an operating mode wherein each of the plurality of memory sections is configured to be selected based at least in part on a second memory address of one of the plurality of memory sections being received at any of the plurality of memory sections.

* * * * *